United States Patent
Mason et al.

(10) Patent No.: US 10,317,799 B2
(45) Date of Patent: Jun. 11, 2019

(54) PATTERNED MULTI-BEAM NANOSHIFT LITHOGRAPHY FOR ON-THE-FLY, HIGH THROUGHPUT PRODUCTION OF CUSTOMIZABLE SHAPE-DESIGNED MICROPARTICLES, NANOPARTICLES, AND CONTINUOUS FILMS

(71) Applicant: The Regents of the University of California, Oakland, CA (US)

(72) Inventors: Thomas G. Mason, Los Angeles, CA (US); Kenny Mayoral, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/583,575

(22) Filed: May 1, 2017

(65) Prior Publication Data
US 2017/0315435 A1    Nov. 2, 2017

Related U.S. Application Data

(60) Provisional application No. 62/329,606, filed on Apr. 29, 2016.

(51) Int. Cl.
*G06F 7/20* (2006.01)
*G03F 7/20* (2006.01)
*G03F 7/00* (2006.01)

(52) U.S. Cl.
CPC .......... *G03F 7/2022* (2013.01); *G03F 7/0037* (2013.01); *G03F 7/201* (2013.01)

(58) Field of Classification Search
None
See application file for complete search history.

(56) References Cited

U.S. PATENT DOCUMENTS

| | | | |
|---|---|---|---|
| 8,193,102 B2 | 6/2012 | Mason et al. |
| 8,377,307 B2 | 2/2013 | Mason |
| 8,562,892 B2 | 10/2013 | Mason |
| 8,617,798 B2 | 12/2013 | Mason et al. |
| 9,051,176 B2 | 6/2015 | Mason |
| 9,090,860 B2 | 7/2015 | Mason |

*Primary Examiner* — Michelle M Iacoletti
(74) *Attorney, Agent, or Firm* — Venable LLP; Henry J. Daley

(57) ABSTRACT

A system and a method of producing sub-millimeter scale particles are provided herein. The method includes providing a substrate that has a layer of photosensitive material thereon; exposing a portion of the layer to a structured beam of light that has a cross-sectional shape, and a cross-sectional size. The cross-sectional size of the structured beam of light at the layer of photosensitive material is smaller than a sub-millimeter scale particle. The method also includes moving the substrate or the beam of light relative to each other to follow a path for making additional exposures or continuous exposure to result in a discrete exposed pattern in the layer that corresponds to the particle being produced, and exposing the layer to the light; and processing the layer to remove unexposed material around the discrete exposed pattern and to separate the discrete exposed pattern from the layer to provide the sub-millimeter scale particle.

22 Claims, 29 Drawing Sheets

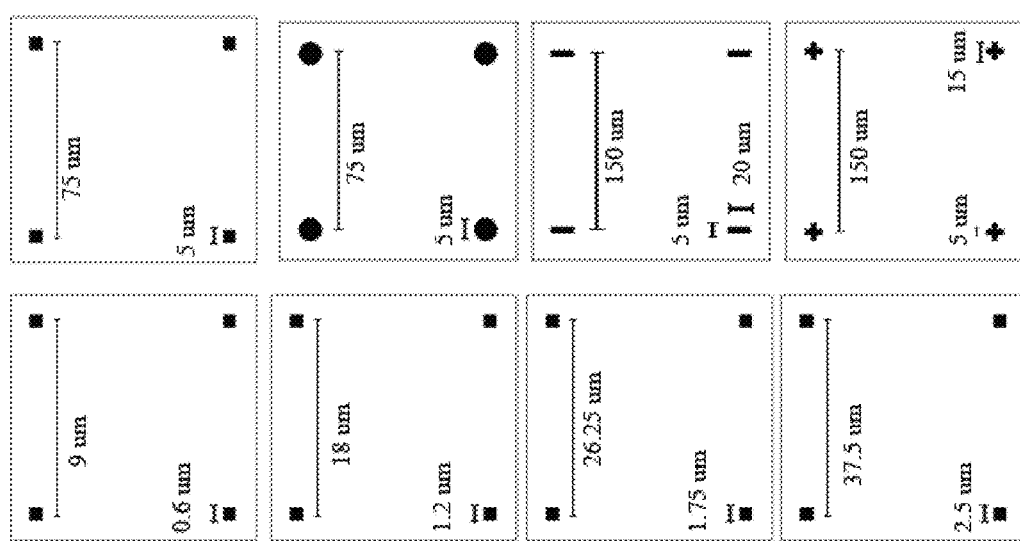

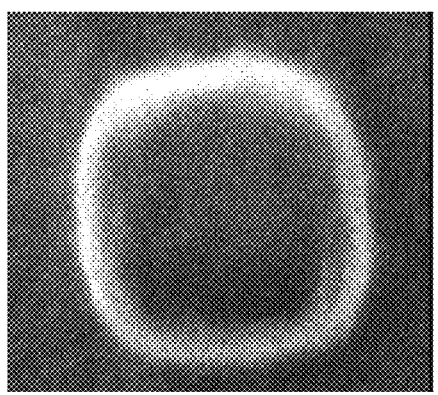
FIG. 3A
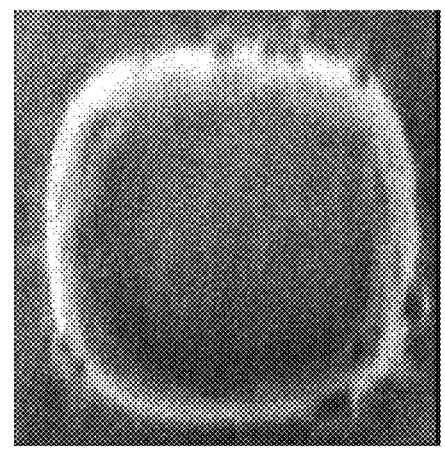
FIG. 3B
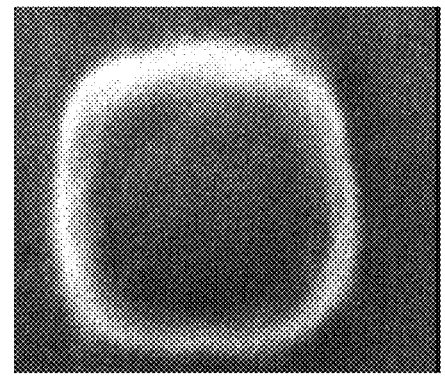
FIG. 3C
FIG. 3D

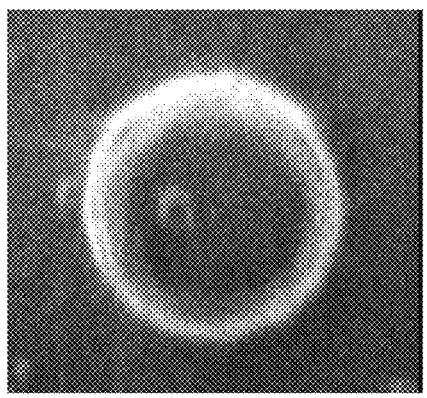
FIG. 5B
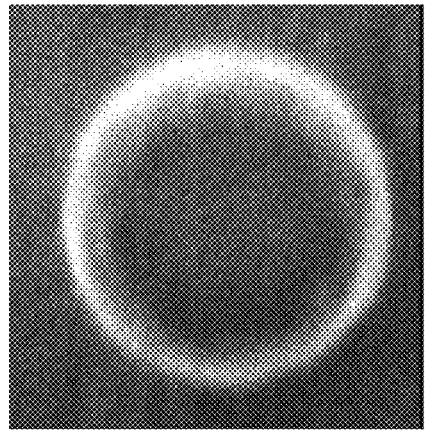
FIG. 5D
FIG. 5A
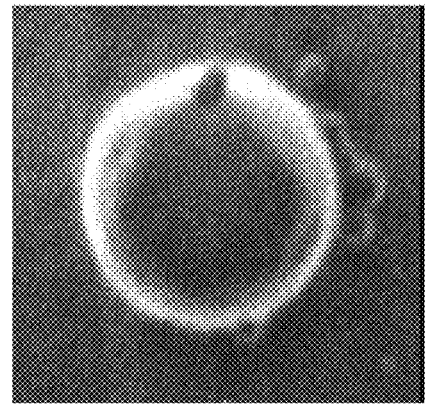
FIG. 5C

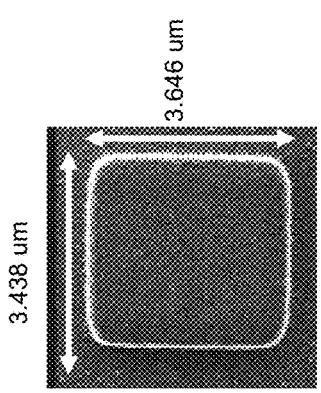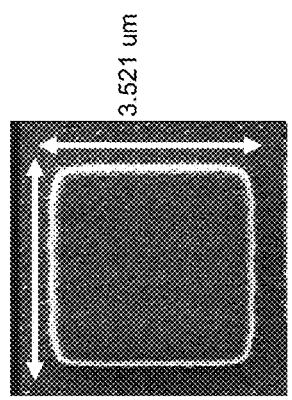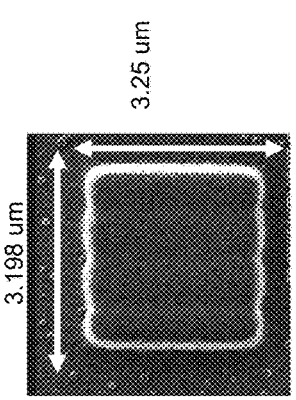
FIG. 12B  FIG. 12D  FIG. 12F
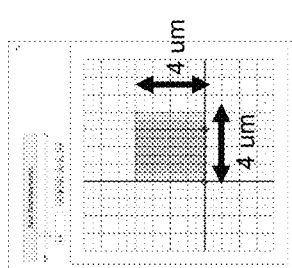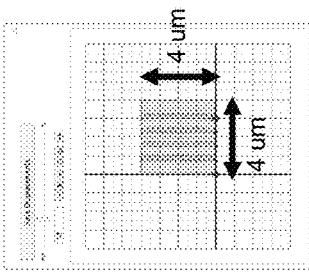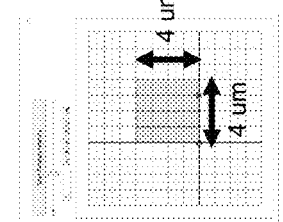
FIG. 12A  FIG. 12C  FIG. 12E

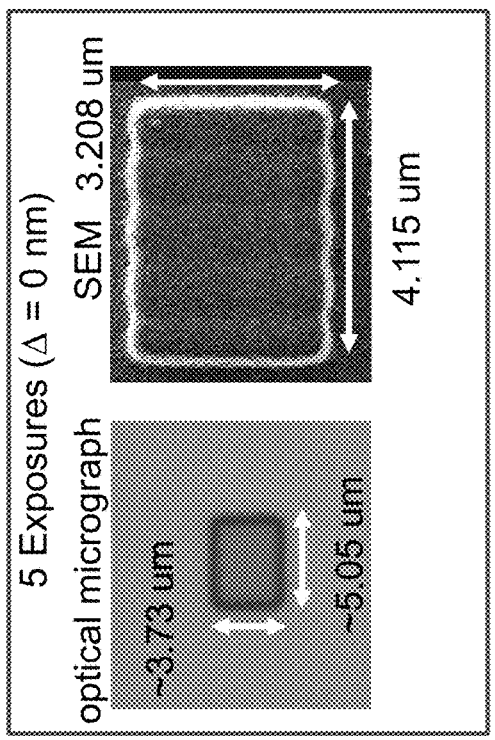
FIG. 13A
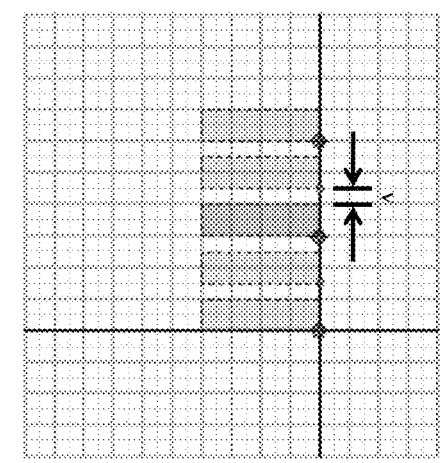
FIG. 13B
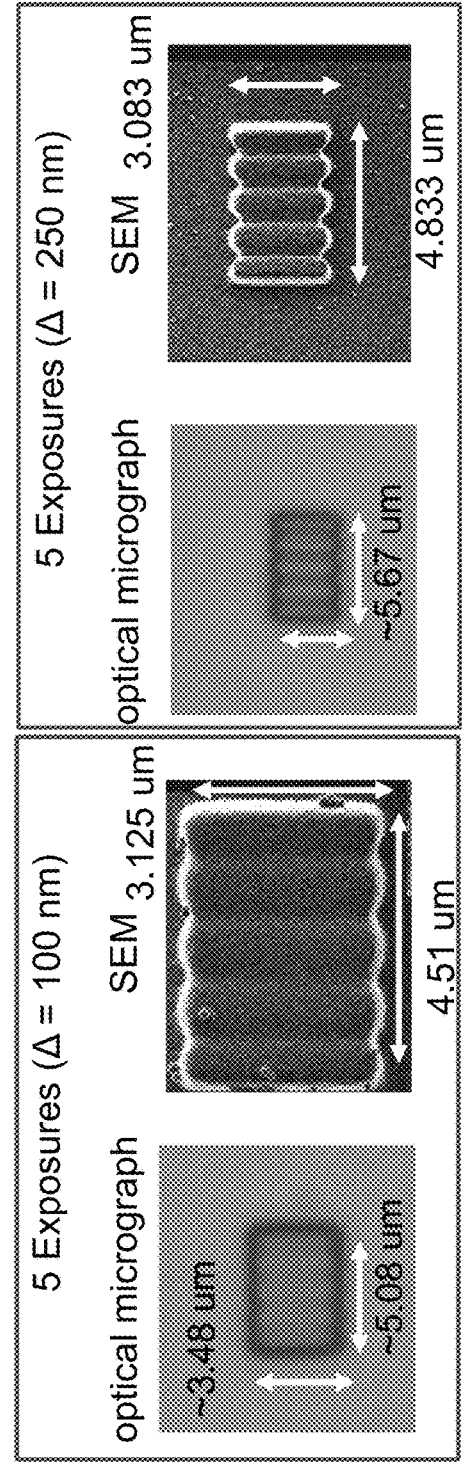
FIG. 13C
FIG. 13D

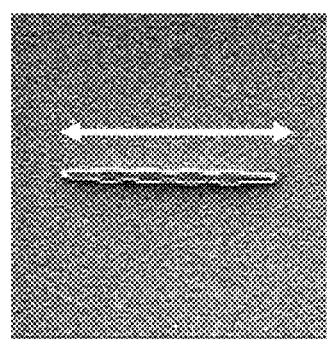
≈ 13 um
FIG. 14B
SEM
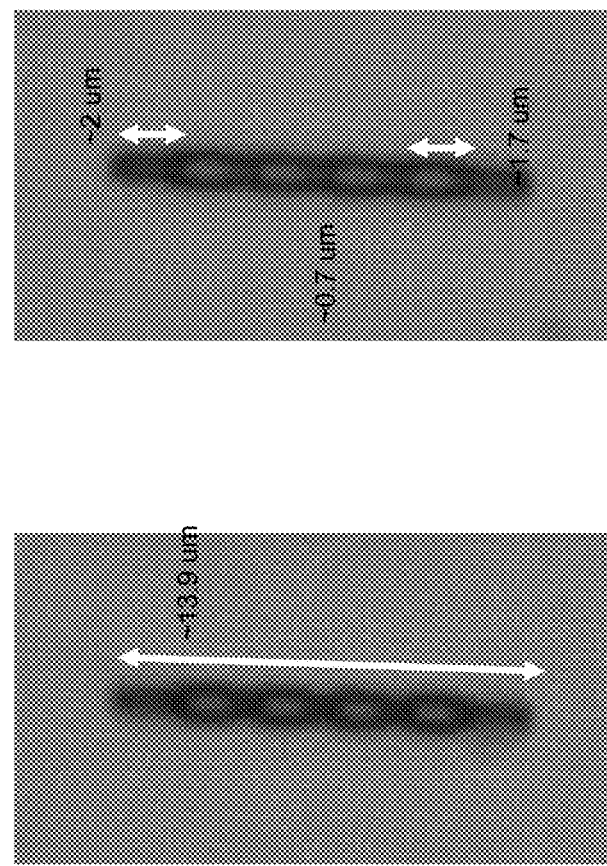
FIG. 14D
optical micrograph
FIG. 14C
optical micrograph
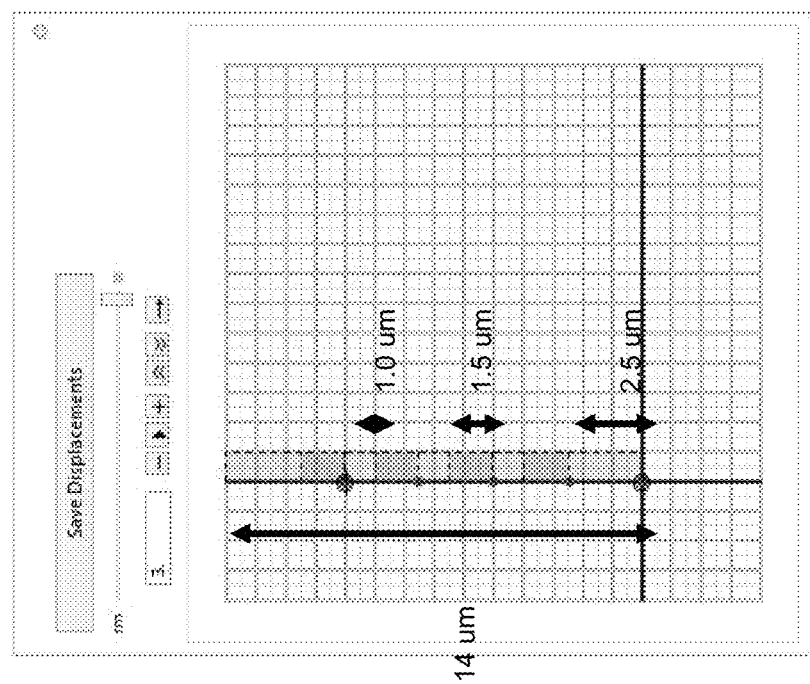
FIG. 14A Optical micrograph of printed array of U-Shapes Transmission Optical Microscopy Images ≈ 4.8 μm

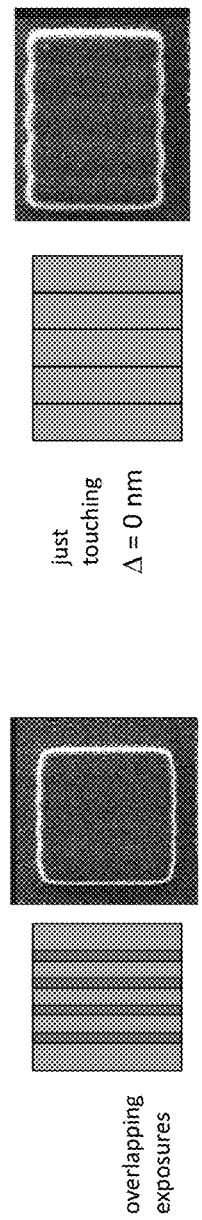
FIG. 26A overlapping exposures
FIG. 26B just touching Δ = 0 nm
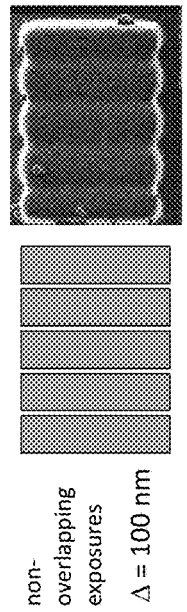
FIG. 26C non-overlapping exposures Δ = 100 nm
FIG. 26D non-overlapping exposures Δ = 250 nm
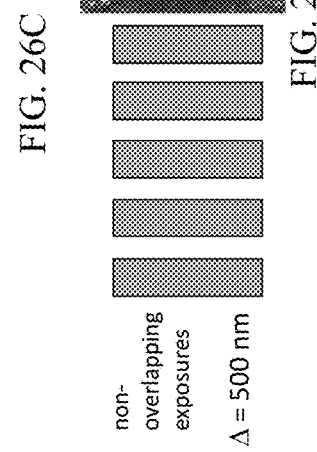
FIG. 26E non-overlapping exposures Δ = 500 nm
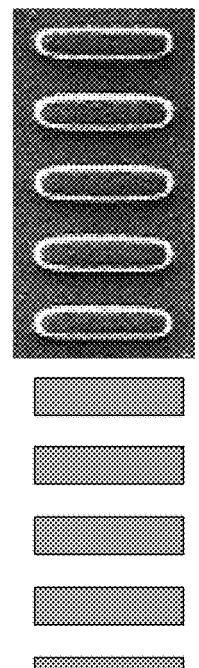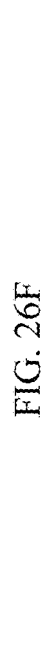
FIG. 26F non-overlapping exposures

PATTERNED MULTI-BEAM NANOSHIFT LITHOGRAPHY FOR ON-THE-FLY, HIGH THROUGHPUT PRODUCTION OF CUSTOMIZABLE SHAPE-DESIGNED MICROPARTICLES, NANOPARTICLES, AND CONTINUOUS FILMS

CROSS-REFERENCE TO RELATED APPLICATIONS

This application claims priority benefit from U.S. Provisional Patent Application No. 62/329,606 filed on Apr. 29, 2016, the entire content of which is incorporated herein by reference. All references cited anywhere in this specification, including the Background and Detailed Description sections, are incorporated by reference as if each had been individually incorporated.

BACKGROUND

1. Technical Field

Some embodiments of the present invention relate to lithographic methods of producing sub-millimeter scale particles and films having sub-millimeter scale substructures, the particles and films, and the systems used for producing the particles and films.

2. Background

Despite many lithography techniques in the prior art, there still remains a need for flexible and adaptable microscale and nanoscale lithographic methods that offer the potential for printing on-the-fly customizable structures in three dimensions. For instance, it would be highly desirable to simultaneously 3D-print many solid objects which have detailed microscale and nanoscale features in parallel without the need to make expensive masks for each new desired shape. Whether additive (i.e. building up materials) or subtractive (i.e. removing materials), programmable 3D manufacturing technologies are transforming the way that complex parts and components are being made at larger length scales. Thus, creating a 3D printing approach that overcomes current existing limitations and mass produces monodisperse sets of objects at size scales far below the millimeter scale would offer numerous benefits including immediacy in obtaining a plurality of complex microscale and nanoscale objects without high overhead costs of money or time, flexibility and customizability in designing a wide range of objects, and in-house and local production thereby providing confidentiality.

SUMMARY OF THE DISCLOSURE

An aspect of the present disclosure is to provide a method of producing sub-millimeter scale particles. The method includes providing a substrate that has a layer of photosensitive material thereon. The method further includes exposing a portion of the layer of photosensitive material to a structured beam of light that has a preselected cross-sectional shape, a preselected cross-sectional size, a preselected wavelength, a preselected intensity of exposure, and a preselected duration of exposure. The preselected cross-sectional size of the structured beam of light at the layer of photosensitive material is smaller than a sub-millimeter scale particle being produced by the exposing. The layer of photosensitive material has a preselected photoresponse to the structured beam of light. The method also includes moving at least one of the substrate or the beam of light relative to each other to follow a preselected path for making at least one of additional exposures or continuous exposure to result in a discrete exposed pattern in the layer of photosensitive material that corresponds to the sub-millimeter scale particle being produced. The method further includes further exposing the layer of photosensitive material to the structured beam of light at least one of continuously or at multiple points along the preselected path; and processing the layer of photosensitive material subsequent to the exposing, the moving and the further exposing to remove unexposed material around the discrete exposed pattern in the layer of photosensitive material and to separate the discrete exposed pattern from the layer of photosensitive material and from the substrate to provide the sub-millimeter scale particle.

Another aspect of the present disclosure is to provide a system for producing sub-millimeter scale particles. The system includes a movable stage; a light exposure system arranged to expose a layer of photosensitive material on a substrate to a beam of light when held on the movable stage. The light exposure system includes a light source that provides light at an exposure wavelength, a mask arranged in an optical path of the light source, the mask having at least one light transmitting area surrounded by light blocking areas so as to form the beam of light from the light source, the beam of light having a preselected cross-sectional shape and a preselected cross-sectional size. The system also includes a light control system configured to control operation of the exposure system to at least turn the beam of light on and off at specific times during operation; and a stage control system arranged to communicate with the movable stage to cause the stage to move along a predetermined path corresponding to a sub-millimeter scale particle being produced. The preselected cross-sectional size of the beam of light is smaller than the sub-millimeter scale particle being produced.

Another aspect of the present disclosure is to provide a method of producing films having sub-millimeter scale substructures. The method includes providing a substrate that has a layer of photosensitive material thereon; exposing a portion of the layer of photosensitive material to a beam of light that has a preselected cross-sectional shape, a preselected cross-sectional size, a preselected wavelength, a preselected intensity of exposure, and a preselected duration of exposure. The preselected cross-sectional size of the beam of light is smaller than a sub-millimeter scale substructure being produced by the exposing. The layer of photosensitive material has a preselected photoresponse to the beam of light. The method also includes moving at least one of the substrate or the beam of light relative to each other to follow a preselected path for making at least one of additional exposures or continuous exposure to result in a pattern in the layer of photosensitive material that corresponds to the sub-millimeter scale substructures in the films being produced. The method further includes further exposing the layer of photosensitive material to the beam of light at least one of continuously or at multiple points along the preselected path; and processing the layer of photosensitive material subsequent to the exposing, the moving and the further exposing to remove unexposed material around the substructures in the layer of photosensitive material and to separate the film from the layer of photosensitive material and from the substrate to provide the film having submillimeter scale sub structures.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

FIGS. 2A-2H depict examples of arrays made in a patterned mask, according to an embodiment of the present disclosure;

FIGS. 3A-3D are scanning electron microscopy (SEM) images of the crosslinked SU-8 photoresist resulting from individual exposures of a square stylus or "pen" in SU-8 photoresist using an ASML stepper, subsequent to post-exposure baking and developing, according to an embodiment of the present disclosure;

FIGS. 5A-5D are SEM images of the crosslinked SU-8 photoresist resulting from individual exposures of a circular stylus or "pen" in SU-8 photoresist, using an ASML stepper, subsequent to post-exposure baking and developing, according to an embodiment of the present disclosure;

FIGS. 12A-12F depict illumination configurations and SEM images of multi-exposure printing by using a piezo stage to move a wafer to create different overlap of exposed regions, according to an embodiment of the present disclosure;

FIGS. 13A-13F depict an illumination configuration showing an adjustable separation Δ between edges of exposure rods, optical micrographs, and SEM images of multi-exposure printing by using a stepper's wafer piezo stage to move the wafer in order to create different separations between exposed regions that either overlap or do not overlap to make connected objects or features, according to an embodiment of the present disclosure;

FIGS. 14A-14D depict an illumination configuration, an SEM image, and two optical micrographs, of a particle composed of crosslinked SU-8 photoresist subsequent to multiple exposures of a rod pen when moved along a length of a 4 μm rod, according to an embodiment of the present disclosure;

FIGS. 26A-26F show various SEM images and their corresponding illumination patterns for rod-like pens having different separations in each illumination pattern, according to various embodiments of the present disclosure;

DETAILED DESCRIPTION

Figure 1:
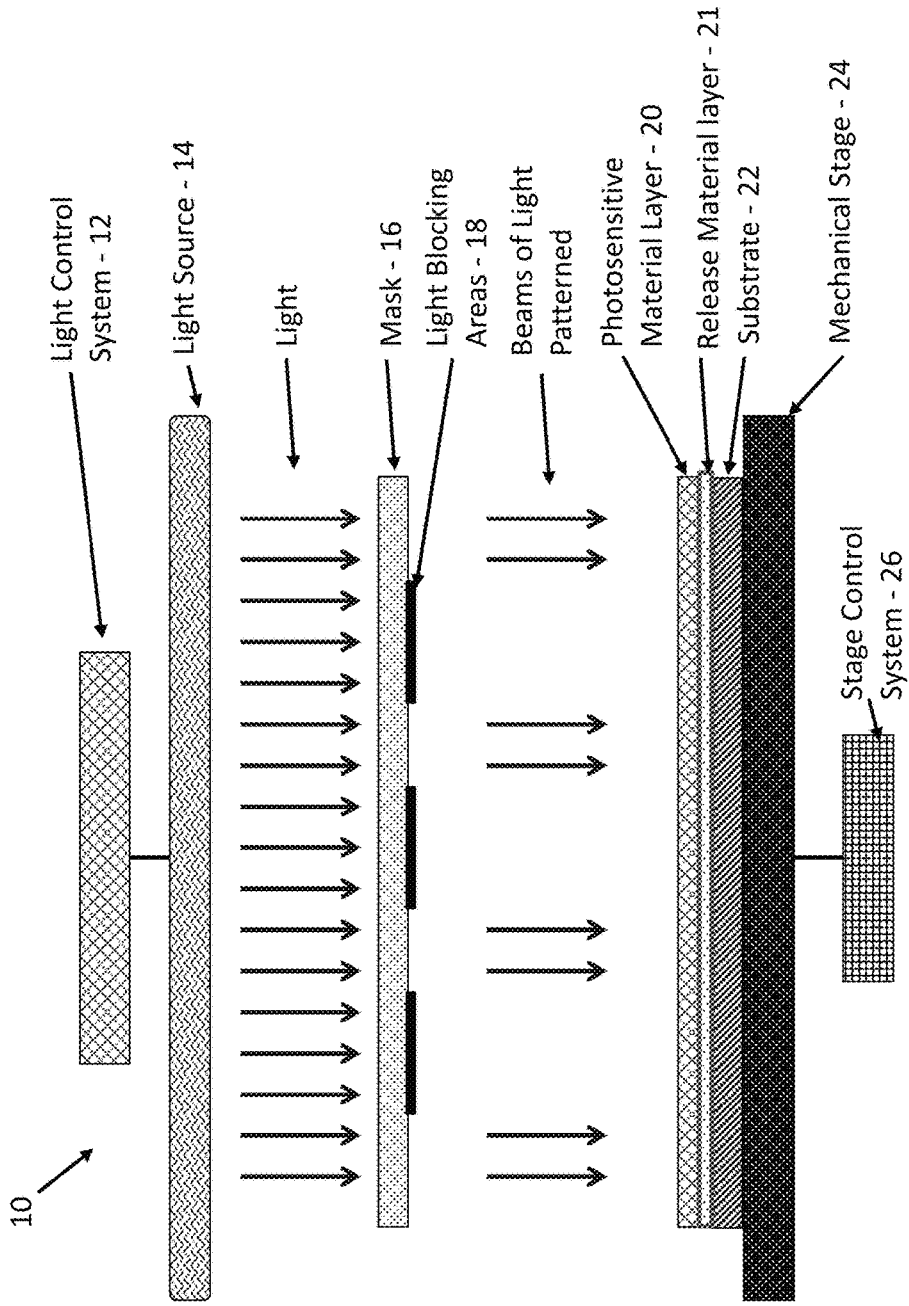
FIG. 1 depicts a schematic diagram of an apparatus for creating particles, according to an embodiment of the present disclosure.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention.

The term "light" as used herein is intended to have a broad meaning to include both visible and non-visible regions of the electromagnetic spectrum, such as, but not limited to infrared, ultraviolet, deep ultraviolet, extreme ultraviolet and x-ray regions of the electromagnetic spectrum, in addition to visible light.

A lithographic method is described herein that can be used to produce many identical isolated structures having a desired customizable shape by repeatedly moving a photoresist-coated substrate with a two-dimensional nanopositioning stage and exposing the photoresist-coated substrate to multiple isolated and patterned beams. This approach is illustrated using, for example, a multi-beam light stylus created using a photolithographic mask and a piezoelectric nanopositioning stage that controls the relative displacement of the photoresist-coated substrate with respect to the photomask. Using an ultraviolet lithographic stepper equipped with a piezoelectric nanopositioning wafer stage and loaded with a photomask that defines the size, shape, and periodicity of discrete stylus beams, many millions of copies of a particular particle shape can be made on a wafer. These copies of particle shape can then be lifted into a liquid containing a stabilizer to form a monodisperse dispersion of colloidal particles. By programming a sequence of exposures of this multi-beam light stylus array and nanoshifts of the substrate, customizable dispersions of particles having nanoscale features can be made. For example, the particles can be made as a consequence of light diffraction. Furthermore, the particle can also be made as a consequence of proximate or even non-overlapping exposures. In addition, beyond making isolated particles, by overlapping exposures of adjacent light beams, continuous grids having shape- and size-customizable porosity can also be created relatively rapidly.

A common limitation of many existing lithographic methods for producing microscale and nanoscale patterns over small regions in parallel is the need to create high-cost lithographic masks, whether optical masks used for exposing photoresists or imprinting masks used for mechanical stamping, whenever new patterns are desired. Parallel lithography approaches, such as short-wavelength optical stepper lithography, can print over large surface areas and offer the benefit of faster production rates compared to single-beam serial lithography methods (e.g., electron-beam or e-beam lithography). However, owing to the smaller wavelength of certain serial approaches, such as e-beam lithography, serial approaches can currently provide smaller feature sizes of printed objects well below 50 nm. Serial approaches include a controllable exposure beam that consists of, for example, at least one of a single light beam, a single x-ray beam, a single neutron beam, a single electron beam, and a single ion beam. Often, these beams are focused to provide a very small beam. However, diffraction can limit the minimum spatial size of the exposing spot produced. Since the monetary and time costs associated with mask production for non-serial lithographic patterning methods are significant, it would be desirable to create a lithographic method that can create customizable lithographic patterns having very small feature sizes in parallel and on-the-fly (when desired) without requiring new masks to be designed and produced every time the pattern is changed. In addition, beyond patterning materials that remain bound to a lithographic substrate, such as a silicon wafer, there are also emerging alternative applications such as using lithographic patterning to create monodisperse shape-designed colloidal particles that are released from the substrate into a fluid. While some control over fabrication of non-prismatic 3D structures has been previously developed, these techniques typically do not allow for on-the-fly changes to the desired shape without designing and producing additional lithographic masks while still simultaneously producing many identical copies of the same pattern or object with nanoscale control over the geometrical sub-particle features (i.e. important contributors to the shape) of the objects.

Therefore, it would also be desirable to develop a parallel optical lithographic method that would enable a significant degree of control over the shapes of the particles in three dimensions (3D), beyond the existing control over the in-plane 2D-prismatic (i.e. plate-like) colloidal shape, without significant additional cost associated with design and production of new masks. If such a method could be developed, it would amount to a form of advanced 3D-printing many copies of 3D-nanostructured colloidal patterns, including isolated particle shapes, in parallel.

According to an embodiment of the present disclosure, the present method combines physical response characteristics, positioning, and patterned multi-beam exposure of a substrate in a new way to create a massively parallel form of a 3D-printer that can create many identical copies of on-the-fly customizable nanostructured surface patterns and dispersions of textured shape-designed colloidal particles dispersed in a liquid. By taking advantage of a piezoelectric nanopositioning stage and the high-throughput and small feature size offered by short-wavelength optical steppers, an array of many patterned structured light beams can be created. In an embodiment, each beam of light is patterned by a photomask to have a particular basic shape, yielding a light-stylus array. By repeatedly moving the 2D nanopositioning stage and exposing, many copies of the desired pattern or object can be drawn in parallel using this light-stylus array onto a photoresist-coated wafer. In some cases, light exposures can be overlapped for different controlled shifts of the nanopositioning stage to draw desired patterns and shapes. Interestingly, in addition, 3D nanoscale textures and features in these patterns and shapes using ideally non-overlapping exposures can also be controlled by taking advantage of natural diffraction inherent in the light-stylus beams. The resulting structures thus can contain a combination of complex 3D features that result from the shape of the light stylus used, the set of coordinates of the nanopositioning stage used for the exposures, the degree of overlap or non-overlap of these exposures, the energy used for each exposure, the intensity-dependent response of the photoresist, determined by its chemical composition, and the post-exposure lithographic processing through baking and development.

In the present disclosure, the term "non-overlapping exposures" is used to mean two or more exposures that would not overlap if diffraction of beams did not exist. In other words, ideal beams that have a certain stylus shape would not touch one another in the absence of diffraction. Because diffraction causes some spreading of many kinds of physical beams, including light beams, some intensity of the exposing beams (e.g., of light beams on the photoresist) may exist outside of the designed exposure regions.

FIG. 1 depicts a schematic diagram of an apparatus for creating particles, according to an embodiment of the present disclosure. In an embodiment, the apparatus 10 includes an optical light source (e.g., a UV light source) 14, a light control system 12 including an optical imaging lens such as in an ultraviolet or deep-ultraviolet stepper lithography system, a photolithography mask 16 using light blocking areas 18 to create one or more basic arrays of stylus shapes, and at least one of a nanopositioning wafer stage 26 (e.g., mechanical stage as depicted in FIG. 1) or a nanopositioning mask stage (not shown in FIG. 1). The apparatus can be used to produce a desired sequence of exposures on a material layer 20 provided on a substrate 22 supported by mechanical stage 24.

Although the present method of creating particles is described herein as being implemented using the apparatus shown in FIG. 1 (e.g., a lithographic apparatus) as it is suited for the fabrication of the particles due to its flexibility. As it can be appreciated, the present method can also be implemented by another type of apparatus other than a lithographic stepper apparatus. Some convenient features of a modern optical lithography stepper for implementing the present method according to an embodiment of the present disclosure are: 1) high degree of uniformity of illumination, 2) high-resolution nanoscale x,y,z and tip-tilt alignment of a wafer relative to the mask over a large area using coarse and fine positioning stages, 3) controllable illumination intensity and/or light exposure energy often made using discrete flashes of light, 4) a very small feature size, which can approach 10 nm-30 nm in some of the most recent kinds of lithographic steppers used for making advanced memory circuitry and central processing units, 5) a clean environment with limited dust, and 6) a high degree of thermal control that prevents thermal expansion or contraction issues which can affect the quality of the alignment and exposure over a large area of exposure.

Multiple electron beams in close proximity can be very difficult to stabilize because electrons are negatively charged particles and repel each other. Therefore, the use of multiple optical beams in close proximity is typically desirable since the photons in adjacent light beams are effectively non-interacting. Moreover, collimated or focused x-ray (very low wavelength electromagnetic radiation) beams can also be used in the present method as a means of exposing to crosslink a material or destroying an x-ray sensitive material that reacts with a patterned x-ray exposure. Thus, at least one of a positive and a negative forms of photo or x-ray lithography could be used in an embodiment of the current disclosure. Likewise, multiple collimated beams of neutral particles (i.e., atoms or molecules) can also be used to implement the present method. The neutral particles beams can be used to build up patterns of a material on a substrate while manipulating a micro-, or nano-positioning stage. Therefore, techniques such as physical vapor deposition and chemical vapor deposition involving collimated beams of at least one of atoms and molecules could be used in combination with a positioning stage (e.g., mechanical stage 24) to create many identical copies of patterns or structured shape-designed objects.

The design of a type and location of styli (i.e. pens) in the mask may be chosen depending on whether separate objects or continuous patterns are desired. For separate, compact objects, a hexagonal array of styli typically provides the highest density and may be somewhat more efficient than other types. For objects that are closer to square in overall shape, a square lattice would be desireable for achieving the maximum dynamic range in overall size of the object. However, if highly elongated objects are desired, then rectangular or oblique arrays would be more suitable. The array spacing does not set a strict limit on the maximal size of separate structures that can be produced, since certain structures can be printed outside of a primitive cell of the lattice without touching adjacent structures. However, the array spacing does provide an approximate length scale associated with the maximal lateral size of discrete compact objects that can be printed. The larger the array spacing is made, the more freedom one has for printing a broader range of sizes of objects. Yet, if the array spacing is larger, the density of printed objects will be lower, fewer objects will be produced in a given area of the substrate using the same set of exposures. Hence, if objects having a wide range of maximal lateral spatial dimensions are to be produced, it may be desirable to have several stylus arrays on the same mask or a few masks that have different array spacings, designed for use in producing smaller or larger objects, yet still maintaining a density of production that is not too sparse.

By contrast, if a continuous interconnected pattern is desired, then choosing the type of the array of styli and the shape of the styli to appropriately match the symmetry of the desired pattern is typically beneficial. Likewise, choosing a smaller array spacing is often desirable, since this would reduce the number of exposures necessary to cause overlap of adjacent patterns into a large-scale continuous object. Therefore, having several different masks with light stylus arrays of several basic shapes in different array configurations and spacings can be desirable to speed up throughput and the range of continuous patterns that can be accurately created. The array spacing is effectively determined by the primitive vectors that define the lattice.

The type, composition (e.g., concentration of photoacid generator and initiator), and thickness of the photoresist layer can also play a role in determining the features of resulting objects and patterns.

Using light, control over the sub-particle features of the objects may be well below the diffraction limit of light at a particular wavelength. Therefore, certain dimensions of patterns or objects can be controlled with nanoscale precision through at least one of the piezoelectric nanopositioning stage, the exposure-response properties of the photoresist, controlled diffraction of the individual exposed stylus pens, and the degree of overlap or non-overlap of exposures of the stylus pens.

According to an embodiment of the present disclosure, the present method offers greater flexibility for printing one-off designs without the need to design and produce a separate mask for each desired pattern or object. This contrasts with prior approaches that have required desired shapes to be designed as-is in the mask pattern for a single exposure.

The method described herein may or may not use discrete exposures. For instance, it is possible for the nanopositioning stage (e.g., mechanical stage 24) to be moving while a continuous optical exposure with the light stylus array is also occurring. In this case, for example, a continuous time-dependent x,y-trajectory for the nanopositioning stage can be programmed into the nanopositioning stage controller. Optionally, a time-dependent intensity of the exposing beams can also be programmed in coordination with the x,y-trajectory to achieve a variation in the final details and dimensions of the developed exposed pattern or object. For most lithographic steppers, it is easier to program a set of discrete shifts and exposure intensities (or energetic doses), so the examples we have provided reflect this feature.

It is also possible to use more than one light stylus shape for commensurate light stylus arrays (same array type and spacing) in the multiple proximate exposures used to create a pattern or set of discrete objects. This typically involves blading off different regions (e.g. zones) of the same mask that can have identical type and array spacings of light styli, yet the shape and size of the stylus beams can be different. Alignment of the exposures using different regions of the same mask typically requires an alignment system that has been pre-calibrated for this purpose, and fiducial marks on the photoresist or substrate may be used for this purpose in order to maintain accurate relative positioning of the exposures. In addition, for steppers equipped with an automating multi-mask loading system and interferometric or dark field alignment systems, it is also possible to change masks in order to obtain light styli that have different shapes or sizes. This enables exposures over a broader area than the blading method and therefore requires less dye exposures, particularly on a reduction stepper system.

Feedback controlled nanopositioning stages offer control down to a length of about one nanometer, and extending this limit to atomic scale is realistic since piezo-positioning is used in techniques such as the scanning tunneling microscopy (STM) technique and the atomic force microscopy (AFM) technique. Ultimately, control over the created features can be set by a complex combination of the shape of the stylus, the degree of overlap or non-overlap of separate exposures of the light stylus beams, and the response properties of the light-sensitive material (e.g. photoresist).

In an embodiment of the present disclosure, a method of massively parallel, high-throughput production of identical isolated microscale and nanoscale objects having tailored shapes using a non-contact lithographic exposure system and a nanopositioning stage can be implemented. The target material 20 (depicted schematically in FIG. 1) is typically a photosensitive resist (e.g., epoxy-based SU-8) that has been deposited (e.g. via spin coating) onto a substrate material 22 (e.g. a silicon wafer), as shown in FIG. 1. Typically, the target material 20 is present in a uniform layer of photoresist that has a thickness that can be set between about 10 nm and about 100 microns. Although not always required, in an embodiment of the present disclosure, it may be useful to deposit a release material 21 onto the substrate material and then deposit the target material on top of the release material 21. The release material 21 facilitates lift-off or extraction of the isolated objects from the substrate material 22 after exposure and development of the target material layer 20.

In an embodiment of the present disclosure, the target material layer 20 after exposure is further processed by a post-exposure baking step at a temperature and duration that provides for an amplification of a crosslinking chemical reaction of the target material that has been exposed to crosslink at least a portion of the exposed regions. The dose-response relationship in size of resulting structures that has been pre-determined according to a calibration that involves the baking temperature and duration as well as the dose of the exposure, the shape and size of the light stylus, the thickness of the photoresist, and the type of substrate. Subsequent to the post-exposure baking step, a development step causes substantially all of the uncrosslinked target material to be removed. The development is typically accomplished by applying a developer solution and agitating to dissolve or etch away the uncrosslinked target material. Post-exposure baking and development is a standard method of processing many photoresists, including SU-8 photoresist; typical recommended conditions for post-exposure baking and developing are provided by the manufacturer or supplier of the photoresist (e.g. MicroChem Inc. for SU-8 photoresist).

In an embodiment of the present disclosure, to implement the present method of producing particles, the lithographic mask 16 is created. FIGS. 2A-2H depict examples of arrays made in a patterned mask, according to an embodiment of the present disclosure. As shown in FIGS. 2A-2H, the mask contains a set of 8 zones having arrays of different stylus sizes and shapes. For example, the arrays within the mask 16 shown in FIGS. 2A-2H contain 5 zones that have square stylus or pen Shapes of different sizes with a varying lattice spacing between the square shapes, one zone with circle stylus shapes in an array, one zone rod stylus shapes in an array and one zone square cross (i.e., plus) shapes in an array. For example, although the masks shown in FIGS. 2A-2E are all of square shapes (i.e. will produce square-shaped beams), the distances between the square shapes in the array and the sizes of the square shapes are not the same. Therefore, the mask 16 contains a repeating array pattern of various stylus shape at a particular size, formed as optically transparent regions having the form of the stylus shapes, in an otherwise optically non-transparent material (light blocking areas 18). For example, as shown in FIGS. 2A-2D, various arrays are made including a square array of transparent disks (see, FIG. 2F), a square array of transparent squares (see, FIGS. 2A, 2B, 2C and 2D), a square array of rectangles (see, FIG. 2G), and a square array of square crosses (i.e. "plus" shapes) (see, FIG. 2H) in a quartz/chrome photomask suitable for optical stepper lithography. The spacing between the centers of each of the stylus shapes in the square array is typically designed to be at least about three times the maximum spatial dimension of a stylus shape in order to provide adequate space for multiple exposures after shifting without causing overlap of exposed regions in the application of making identical discrete particles. For instance, in using this approach on an optical lithographic stepper, the mask may be a quartz/chrome mask that has been fabricated using electron beam lithography by one of many manufacturers of such masks (e.g. Digidat in Pasadena, Calif.). In this case, the chrome is the optically non-transparent material (light blocking areas 18), and electron beam lithography is used to etch away the chrome on the mask in order to form the repeating array pattern of transparent stylus shapes. It is typically desirable to use a non-contact form of lithography, such as a stepper device, in order to preserve the fidelity of the mask over many repetitions of exposures. The mask 16 may contain other markings for identification and for alignment purposes (e.g. fiducial marks) that would enable the use of multiple different stylus shapes that have the same repeating array pattern. A single repeating array pattern can be designed to extend over the entire area of a mask, or two or more repeating array patterns that have different stylus shapes and sizes. The maximum spatial dimension of each stylus shape on a mask is typically between about 10 nm and about 100 microns. For reduction stepper lithography (e.g., for an Ultratech XLS or ASML stepper that has a factor of 5 in reduction), the effective size of the stylus shapes on the mask are designed to be 5 times larger in spatial dimension than the final desired printed stylus size used to form the isolated particles through shifting exposure.

In an embodiment of the present disclosure, a periodic 2D array of light stylus shapes that are designed into the mask can be characterized by two primitive vectors, $a_1$ and $a_2$, that specify the directions and distances between the center of a given light stylus shape and the centers of two adjacent light stylus shapes in the array. These primitive vectors can be chosen and designed in order to lead to arrays of the following types: square, rectangular, rhombic, hexagonal, and oblique; these array types encompass all known types of simple lattices in 2D. Some space-filling lattices in 2D are Bravais lattices that have primitive vectors $a_1$ and $a_2$. In an embodiment, the magnitudes of the primitive vectors, $|a_1|$ and $|a_2|$, are chosen and designed so that they are larger than the maximum in-plane spatial dimension of the light stylus shape. Otherwise, the light stylus shapes would usually not be discrete but instead would be interconnected. Moreover, many light stylus shapes are spatially aniosotropic (i.e. other than circular shapes). Therefore, in the design of the mask, an axis of symmetry or a pointing direction of the light stylus shape can be chosen to be oriented at an angle $\beta$ relative to the primitive vector $a_1$. The magnitudes of the primitive vectors, therefore, typically set a limit on the maximum size of the lateral dimensions of the light stylus shapes. In an embodiment, it may be desirable to choose $|a_1|$ and $|a_2|$ so that they are significantly larger than the maximum spatial dimension of the light stylus shape used, yet significantly smaller than the maximum spatial dimension of the mask itself, so that many replicates of the light stylus shape can be placed in the array for purposes of mass production of the desired shape.

In an embodiment of the present disclosure, a mask is designed to have a plurality of light stylus shapes suitable for transmitting structured light beams arranged in an ordered array according to primitive vectors $a_1$ and $a_2$ such that the light stylus shapes are oriented with respect to $a_1$ by an angle $\beta$. The set of exposures defining the exposure path to make a desired particle shape using a given light stylus shape is thus typically chosen and designed with respect to at least one of these two primitive vectors and for anisotropic light stylus shapes also the angle $\beta$.

In an embodiment of the present disclosure, the mask is designed to have complex non-Bravais lattices that can be used to arrange the relative proximity of light stylus shapes. An example of a complex non-Bravais lattice is a honeycomb lattice.

In an embodiment of the present disclosure, the mask is designed to have interpenetrating lattices of different light stylus shapes. For example, a rectangular array of triangular light stylus shapes can be interpenetrated with a rectangular array of square light stylus shapes, where the two lattice vectors $a_1$ and $a_2$ are substantially the same, yet one array is offset relative to the other so that none of the light stylus shapes are overlapping on the mask.

A substrate material 22 (e.g. a polished silicon wafer) is prepared by depositing a uniform layer of release material 21 (e.g. LOR or Omnicoat by MicroChem Inc.) onto the substrate material 22. This can be accomplished, for instance, using standard procedures by spray-coating or spin-coating a liquid solution containing the release material 21 onto the substrate material 22 and baking to remove any solvent. The thickness of the uniform layer of release material 21 after deposition is typically between about 5 nm and 1 micron. Thicker release layers 21 can be used successfully but use of large quantities of release material 21 can introduce higher costs of implementing the method without necessarily improving the outcome of the lithographic process. Onto this uniform layer of release material 21, a uniform layer of a target material 20 (e.g. a photosensitive resist material such as SU-8) is deposited. This can be accomplished, for instance, using standard procedures by spray coating or spin coating a liquid solution containing the target material (photosensitive material) 20 onto the uniform layer of release material 21 and baking to remove any solvent. The thickness of the uniform layer of target material 20 after deposition is typically between about 5 nm and about 50 microns. As an example, a 0.500 mm thick prime silicon wafer that has a diameter of about four inches and is smooth and polished as a substrate material 22 is used. A uniform layer having 20 nm thickness of Omnicoat as a release material layer 21 using spin coating and baking (according to manufacturer specifications) is deposited on the substrate material 22. A uniform layer having 1.0 micron thickness of SU-8 2001 photoresist (manufactured by MicroChem, Inc.) as a target material 20 is deposited on the release material layer 21 using spin coating and baking (according to manufacturer specifications). Such a prepared wafer has a uniform layer of a release material 21 and a uniform layer of a target material 20 is suitable for use in a lithographic stepper.

The lithographic mask and the prepared wafer are loaded into a lithographic exposure system, such as a reduction stepper device (e.g. Ultratech XLS i-line stepper or ASML i-line stepper). The lithographic exposure system or apparatus 10 is equipped with a means of exposing the prepared wafer or substrate 22 to light having an appropriate wavelength and intensity to cause a photoreaction to occur in the target material 20. The lithographic exposure system or apparatus 10 is equipped using a positioning or mechanical stage 24 that can precisely move at least one of the prepared wafer or substrate 22 and the lithographic mask 16 in two dimensions (x- and y-directions). For instance, an optical stepper lithographic system or apparatus typically exposes a prepared wafer using light that has a wavelength near to or smaller than an ultraviolet wavelength. An optical stepper lithographic system also typically has a wafer positioning stage control system 26 that enable the manipulation of the wafer in coarse and fine modes. Coarse positioning stages in steppers typically use interferometry in combination with computer feedback control to obtain precise coarse displacements in orthogonal x- and y-directions using a geared mechanical stage. Fine positioning stages in steppers typically rely upon piezoelectric nanopositioners (i.e. "piezos") in x- and y-directions that can move the wafer distances ranging from about 1 nm up to about 200 microns. The lithographic apparatus 10 is also typically equipped with a lens (not shown) that provides a way of focusing patterned light that is transmitted through the array of transparent stylus regions on the photomask onto the prepared wafer in order to expose the photosensitive target material 20. The apparatus/stepper is also typically equipped with a light source 14 (e.g., ultraviolet light source) and light exposure control system 12 that enables the control of the degree of exposure of the target material 20 by the patterned light emerging from the photomask 16. For example, in a stepper, an exposure is accomplished by a discrete flash that delivers a certain number of mJ/cm$^2$ of photonic energy of ultraviolet light to the target material in order to induce a photochemical reaction in the target material (e.g. to cause a photo-acid generator to generate a proton that can in turn lead to cross-linking of the photoresist, potentially assisted by a post-exposure baking procedure).

In an embodiment of the present disclosure, the mask 16 containing the array of transparent stylus shapes of etched-away chrome (i.e., optical "pens") is loaded into a 5:1 reduction Hg i-line stepper apparatus/device 10. A 0.5 mm thick Si wafer (substrate 22), which has been spin-coated with a layer of release material 21 (e.g. LOR at 100 nm thickness) and then spin-coated with a layer of photoresist 20 (e.g., SU-8 2001 at 1.0 micron thickness), is loaded onto the wafer-chuck which is mounted to the stepper's coarse and fine x-y stage (mechanical stage 24). A custom-written computer program that contains information about the selected stylus size, shape, and lattice on the mask 16, a discrete set of displacements of the wafer (substrate 22) in order to produce a desired particle shape, and a discrete set of exposure energies per unit area corresponding to elements in the discrete set of displacements is electronically transmitted to the stepper device 10. After the tip-tilt stages of the stepper apparatus/device 10 have created a condition of parallelness of the planes of the mask 16 and the surfaces of the wafer 22 (e.g. using feedback control and piezoelectric nanopositioners of the tip-tilt stage), a first portion of the SU-8 photoresist layer 20 on the Si wafer (substrate 22) is exposed with a first exposure having a first exposure energy per area $E_1$ and a first exposure position $(x_1, y_1)$ of the coated wafer/substrate 22 relative to the mask 16 using light patterned by the mask 16 and focused on the layer of SU-8 photoresist 20 by the lens of the stepper apparatus/device 10. Subsequently, the wafer/substrate 22 is controlled by a computer program that is fed to the stepper apparatus/device 10 to cause the stepper apparatus 10 to move the fine wafer stage 24 (e.g. using its piezoelectric nanopositioners) to a new exposure position that is different than the first exposure position. The stepper apparatus 10 is then commanded by the computer program to expose a second portion of the SU-8 photoresist layer 20 on the Si wafer (substrate 22) using a second exposure energy per area $E_2$ and a second exposure position $(x_2, y_2)$ of the coated wafer relative to the mask 16 using light patterned by the mask 16 and focused on the layer of SU-8 photoresist 20 by the stepper's lens. A first relative displacement between the first exposure position and the second exposure position is given by the difference in positions: $(\Delta x_1, \Delta y_1) = (x_2 - x_1, y_2 - y_1)$. In an embodiment, the first relative displacement can be pre-specified in the computer program that is transmitted to the stepper apparatus 10. The described process of moving the wafer/substrate 22 and exposing the wafer/substrate 22 to UV light in the stepper apparatus 10 is repeated N times, where N is an integer number, as necessary in order to generate a desired set of exposures and exposure positions, as commanded by the computer program fed to the stepper apparatus 10. The wafer/substrate 22 is then unloaded from the stepper apparatus 10 and developed according to standard procedures, yielding a discrete set of shapes that have features caused by the combination of the selected stylus shape and size, the set of relative displacements $\{(\Delta x_i, \Delta y_i)\}$, and the set of exposure energies (i.e. doses) per area $\{E_i\}$, where i is an integer ranging from 1 to N, as specified by the computer program that is transmitted to the stepper apparatus 10.

In an embodiment of the present disclosure, a feature of a particle shape is imparted by at least one non-overlapping second exposure using the stylus-pen shapes, leading to at least one of a controlled surface corrugations, a controlled roughness, and a controlled hole in a feature of a particle shape.

In an embodiment of the present disclosure, a feature of a particle shape is imparted by at least one zero overlapping second exposure using the stylus-pen shapes, leading to at least one of a controlled surface corrugations, a controlled roughness, and a controlled hole in a feature of a particle shape.

In an embodiment of the present disclosure, a feature of a particle shape is imparted by at least one overlapping second exposure using the stylus-pen shapes, leading to at least one of a controlled surface corrugations, a controlled roughness, and a controlled hole in a feature of a particle shape.

A non-obvious aspect of the present disclosure is the mass-production and precise control over small-scale features of a desired particle shape that can be controlled by a combination of the stylus shape and size, the set of relative displacements, and the set of exposure energies per area. Particularly, a non-overlapping second exposure that leads to connected features of a particle shape through controlled diffraction of proximate but non-overlapping first and second exposures is especially non-obvious.

In an embodiment of the present disclosure, a 3D feature of a particle shape is imparted to a plurality of particles produced by controlling at least one of the relative positions and the exposure doses of two or more exposures made on a photosensitive material using a plurality of collimated light stylus beams that have a pre-specified beam shape.

As it must be appreciated, the method according to the current disclosure differs from existing lithography methods involving multi-lens arrays because the patterned beams of light in the present disclosure are both collimated and also have a particular patterned stylus shape that can be customized (e.g. square, rod, plus, toroidal). By contrast, beams of light coming from methods involving multi-lens arrays in the prior art are not collimated and are circular so they do not have a customizable shape. In the present invention, a multi-lens array is not needed in order to produce the plurality of collimated patterned beams having a particular stylus shape. Moreover, in the present invention, diffraction is used to advantage to create interconnected objects that have desired sub-particle 3D features even when exposures are non-overlapping.

In an embodiment of the present disclosure, one salient feature is that a wide variety of particle shapes can be mass-produced lithographically using only a single mask 16.

This features allows reducing the cost in manufacturing a variety of customized particle shapes because masks of the desired shapes do not have to be manufactured. Instead, the stepper apparatus 10 is programmed to use just a single mask 16 containing several different arrays of stylus pens in order to generate a set of exposures (a plurality of exposures) to create a desired particle shape using a set of relative displacements and exposures per area. Therefore, the method described herein reduces cost of mask manufacture that would otherwise be necessary in generating different particle shapes in conventional methods. Indeed, in conventional method, numerous masks must be used in order to create different particle shapes.

Furthermore, instead of making 3D particle shapes using multiple exposures of a plurality of layers of photoresist that are deposited successively, 3D particle shapes are made using a single layer of photoresist through a control of a relative positioning of two or more exposures (a plurality of exposures) with controlled doses, delivered by the light stylus pens. The 3D shapes can be created by using a nanopositioning, diffraction, and the dose-crosslinking response of the photoresist. The feature of subjecting a single resist layer to multiple light exposures while controlling the positioning of the resist layer, the dimensions of the stylus features and the does delivered by the light stylus to create desired 3D shapes is novel.

In addition to producing disconnected shapes, such as particles, the method according to an embodiment of the present disclosure can also be used to produce porous interconnected membranes that can span a large total area. In this case, a set of relative displacements can be selected to be at least comparable to or greater than the effective lattice spacing between stylus pens in the array, thereby causing interconnections between each printed region over the entire photoresist layer. By this approach, fabrication of highly controlled porous membranes that have pore shapes and sizes controlled by the set of relative displacements and the stylus pen shape can be achieved.

While in the above paragraphs refer to an array of collimated stylus beams, the array need not be a spatially ordered array in order for the present method of production of particles to be practiced. A disordered array of beams that still maintain a certain overall minimum spacing between adjacent beams can still be used to create a plurality of disconnected individual objects. However, for certain application or in certain conditions, it may be beneficial to use an ordered array of stylus beams. For example, an ordered array of stylus beams can ensure that overlap of exposures with adjacent regions be avoided if producing a plurality of disconnected discrete objects is desired.

The production of various shapes that have controlled nanoscale corrugations on its side edges, as shown by a scanning electron microscope (SEM) image of the triangular frame (i.e. open triangle) particle are demonstrated herein. The controlled undulations on the edges have a magnitude of about ±20 nm, well below the Abbe diffraction limit of about ≈200 nm of the exposing ultraviolet light. The super-resolution lithography resolution of this undulation is created by a combination of the shape of the stylus beam and the high precision of the nanopositioning stage in controlling relative separate exposures. In addition, the periodicity of the undulations along the edges is also set by the relative spacing of the exposures and the choice of shape of the pen stylus.

Figure 4:
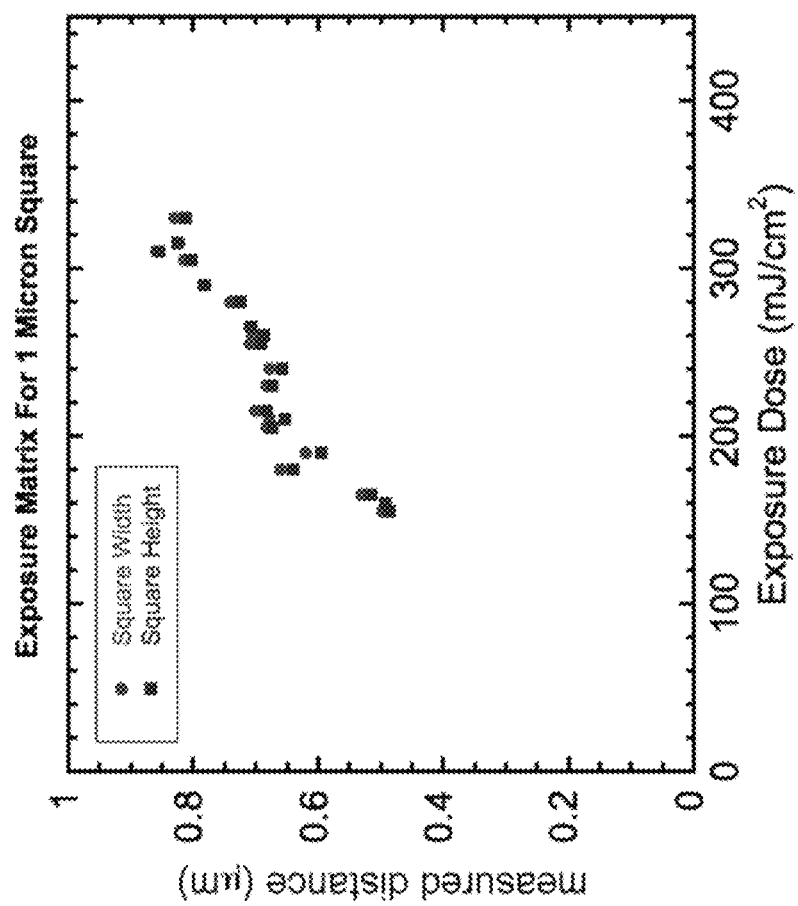
FIG. 4 is a plot of the printed feature size (square width and height, respectively) versus exposure dose, according to an embodiment of the present disclosure.

FIGS. 3A-3D are scanning electron microscopy (SEM) images of the crosslinked SU-8 photoresist resulting from individual exposures of a square stylus or "pen" in SU-8 photoresist using an ASML stepper, subsequent to post-exposure baking and developing, according to an embodiment of the present disclosure. These images show the square pen features obtained or printed when using UV light at 365 nm on a 1 µm layer thickness of SU-8 photoresist. The effective pen size and shape can be controlled by exposure dose in a single exposure by the stepper apparatus at one (x,y) position of the wafer. FIG. 3A shows a printed square pen feature at 165 mJ/cm$^2$. FIG. 3B shows a printed square pen feature at 230 mJ/cm$^2$. FIG. 3C shows a printed square pen feature at 260 mJ/cm$^2$. FIG. 3D shows a printed square pen feature at 310 mJ/cm$^2$. FIG. 4 is a plot of the printed feature size (square width and height, respectively) versus exposure dose, according to an embodiment of the present disclosure. As shown by this plot, increasing the exposure dose increases the size of the printed square feature.

Figure 6:
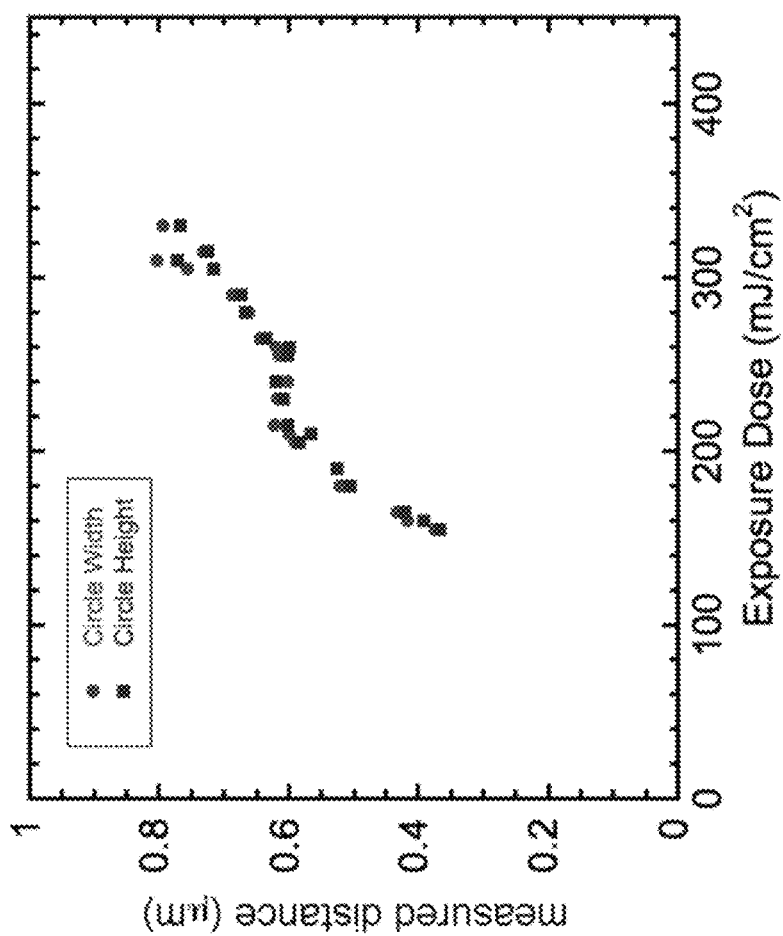
FIG. 6 is a plot of the printed feature size (diameter of the circular "spot" feature) versus exposure dose; according to an embodiment of the present disclosure.

FIGS. 5A-5D are SEM images of the crosslinked SU-8 photoresist resulting from individual exposures of a circular stylus or "pen" in SU-8 photoresist, using an ASML stepper, subsequent to post-exposure baking and developing, according to an embodiment of the present disclosure. These images show the circular pen features obtained or printed when using UV light at 365 nm on a 1 µm layer thickness of SU-8 photoresist. The effective pen size and shape can be controlled by exposure dose in a single exposure by the stepper apparatus at one (x,y) position of the wafer. FIG. 5A shows a printed circular pen feature at 165 mJ/cm$^2$. FIG. 5B shows a printed circular pen feature at 230 mJ/cm$^2$. FIG. 5C shows a printed circular pen feature at 260 mJ/cm$^2$. FIG. 5D shows a printed circular pen feature at 310 mJ/cm$^2$. FIG. 6 is a plot of the printed feature size (diameter of the circular "spot" feature) versus exposure dose; according to an embodiment of the present disclosure. As shown by this plot, increasing the exposure dose increases the size or diameter of the printed circular feature.

Figure 7B:
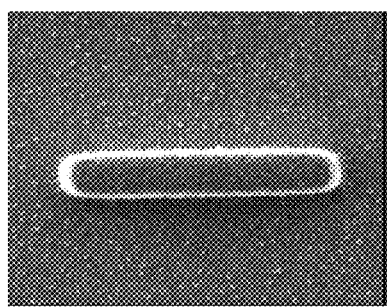
FIGS. 7A-7D are SEM images of the crosslinked SU-8 photoresist resulting from individual exposures of a rod-like stylus or "pen" in SU-8 photoresist, using an ASML stepper, subsequent to post-exposure baking and developing, according to an embodiment of the present disclosure.
Figure 7D:
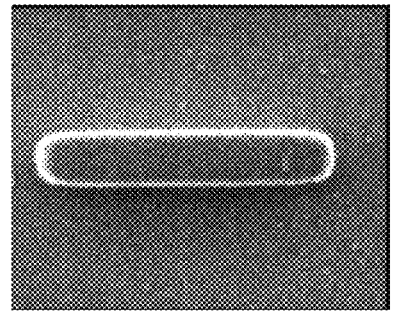
Figure 7A:
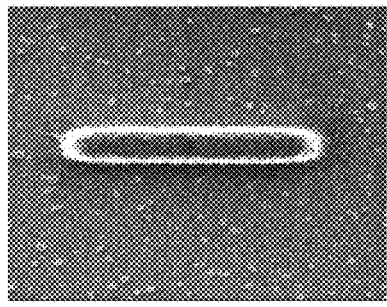
Figure 7C:
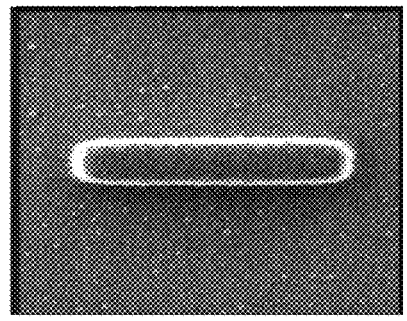
Figure 8:
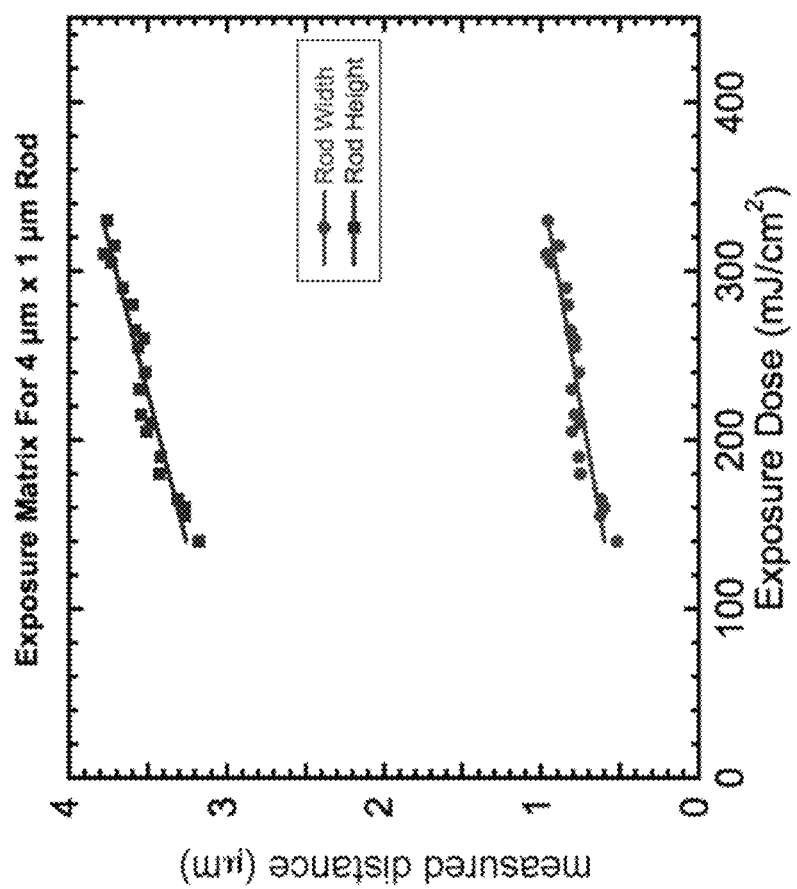
FIG. 8 is a plot of the printed feature size (measured width and height) versus exposure dose, according to an embodiment of the present disclosure.

FIGS. 7A-7D are SEM images of the crosslinked SU-8 photoresist resulting from individual exposures of a rod-like stylus or "pen" in SU-8 photoresist, using an ASML stepper, subsequent to post-exposure baking and developing, according to an embodiment of the present disclosure. These images show the rod-like features obtained or printed when using UV light at 365 nm on a 1 µm layer thickness of SU-8 photoresist. The effective pen size and shape can be controlled by exposure dose in a single exposure by the stepper apparatus at one (x,y) position of the wafer. FIG. 7A shows a printed rod-like pen feature at 165 mJ/cm$^2$. FIG. 7B shows a printed rod-like pen feature at 230 mJ/cm$^2$. FIG. 7C shows a printed rod-like pen feature at 260 mJ/cm$^2$. FIG. 7D shows a printed rod-like pen feature at 310 mJ/cm$^2$. FIG. 8 is a plot of the printed feature size (measured width and height) versus exposure dose, according to an embodiment of the present disclosure. As shown by this plot, increasing the exposure dose increases the size of the printed features.

Figure 9B:
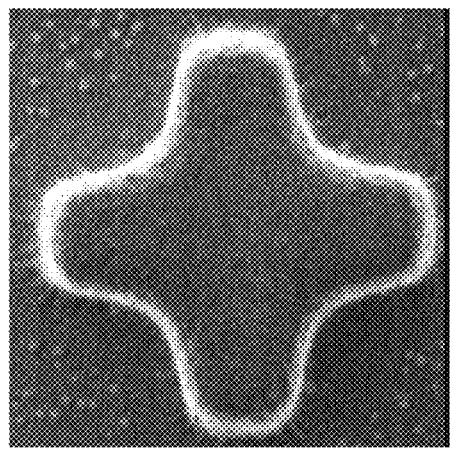
FIGS. 9A-9D are SEM images of the crosslinked SU-8 photoresist resulting from individual exposures of a square cross-like "+" stylus or "pen" in SU-8 photoresist, using an ASML stepper, subsequent to post-exposure baking and developing, according to an embodiment of the present disclosure.
Figure 9D:
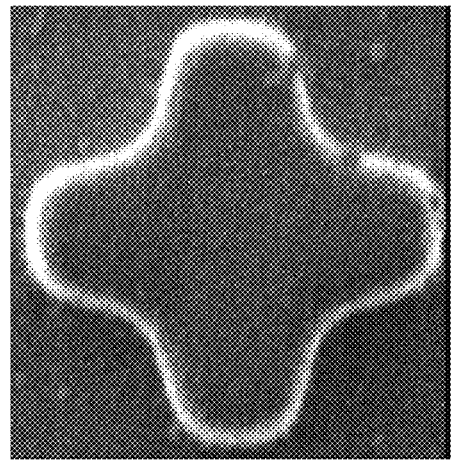
Figure 9A:
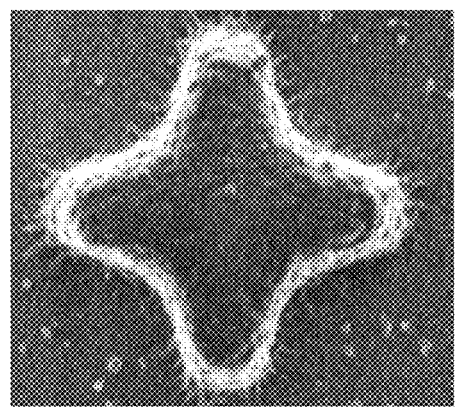
Figure 9C:
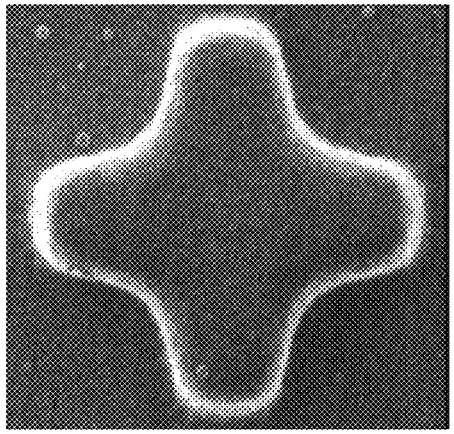
Figure 10:
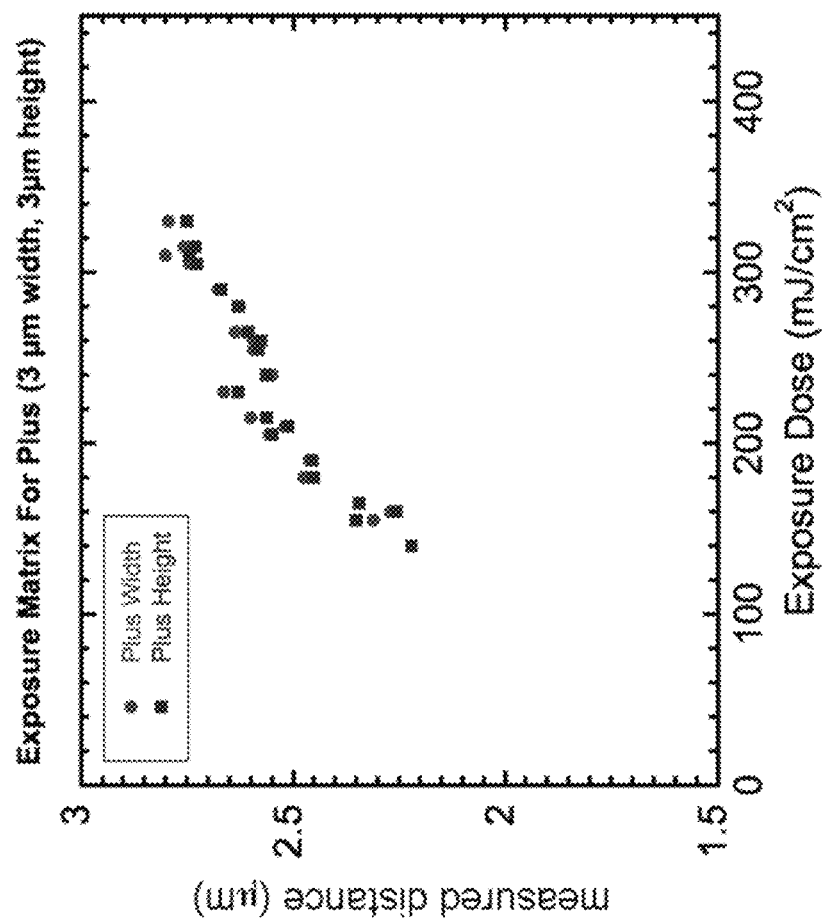
FIG. 10 is a plot of the printed feature size (measured width and height) versus exposure dose, according to an embodiment of the present disclosure.

FIGS. 9A-9D are SEM images of the crosslinked SU-8 photoresist resulting from individual exposures of a square cross-like "+" stylus or "pen" in SU-8 photoresist, using an ASML stepper, subsequent to post-exposure baking and developing, according to an embodiment of the present disclosure. These images show the cross-like features obtained or printed when using UV light at 365 nm on a 1 µm layer thickness of SU-8 photoresist. The effective pen size and shape can be controlled by exposure dose in a single exposure by the stepper apparatus at one (x,y) position of the wafer. FIG. 9A shows a printed cross-like pen feature at 165 mJ/cm$^2$. FIG. 9B shows a printed cross-like pen feature at 230 mJ/cm$^2$. FIG. 9C shows a printed cross-like pen feature at 260 mJ/cm$^2$. FIG. 9D shows a printed cross-like pen feature at 310 mJ/cm$^2$. FIG. 10 is a plot of the printed feature size (measured width and height) versus exposure dose, according to an embodiment of the present disclosure. As shown by this plot, increasing the exposure dose increases the size of the printed features. In addition, the smaller cross-like feature appears more rounded and textured with a rough surface whereas the largest cross-like feature appears less rounded with a smoother surface.

As it can be appreciated from the above paragraphs, the mask 16 is configured to impart a sub-particle geometrical feature (at least one of either an in-plane or out-of-plane sub-particle geometrical feature) such that a shape of the patterned beam of light (see, FIG. 1) having a preselected cross-sectional shape and a preselected cross-sectional size (see, for example FIGS. 2A-2H) is different from a shape of the final particle produced (see, for example FIGS. 3A-3D, FIGS. 5A-5D. FIGS. 7A-7D, FIGS. 9A-9D).

Figure 11B:
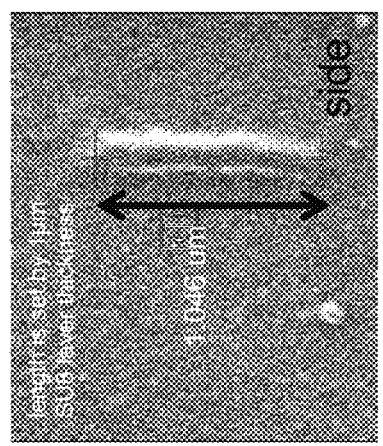
FIGS. 11A-11E are SEM images of crosslinked SU-8 photoresist features resulting from individual exposures of a square stylus or "pen" having different sizes in SU-8 photoresist down to sub-wavelength sizes, using an ASML stepper, subsequent to post-exposure baking and developing, according to an embodiment of the present disclosure.
Figure 11A:
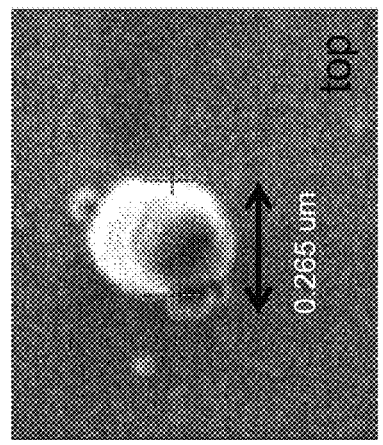
Figure 11E:
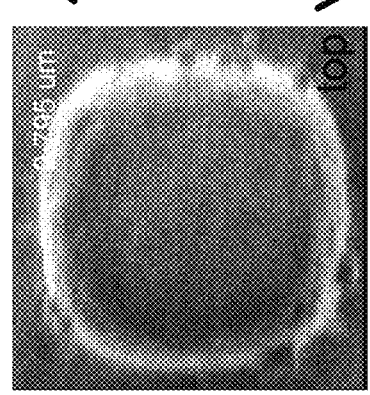
Figure 11D:
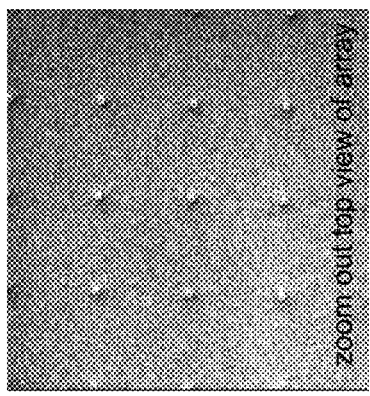
Figure 11C:
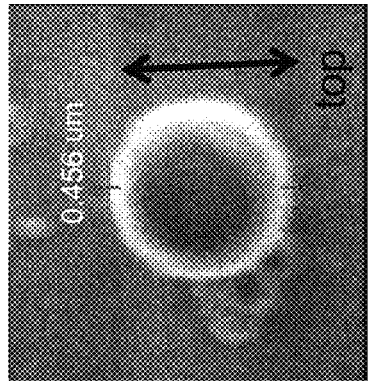
Figure 13F:
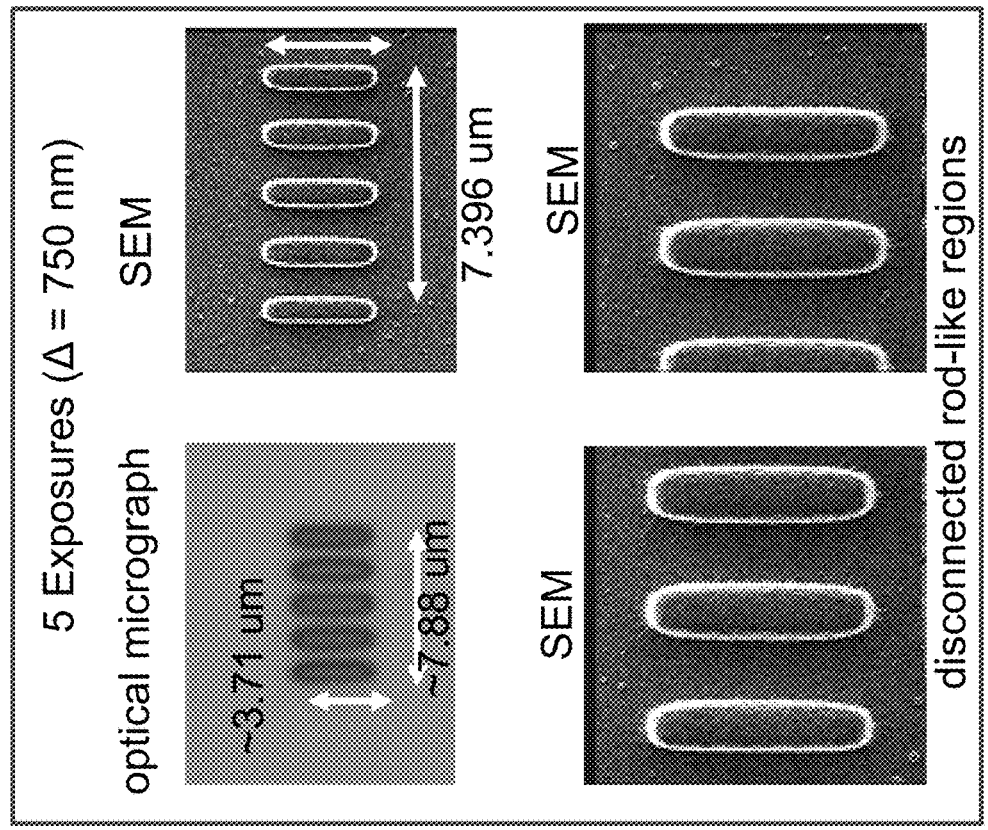
Figure 13E:
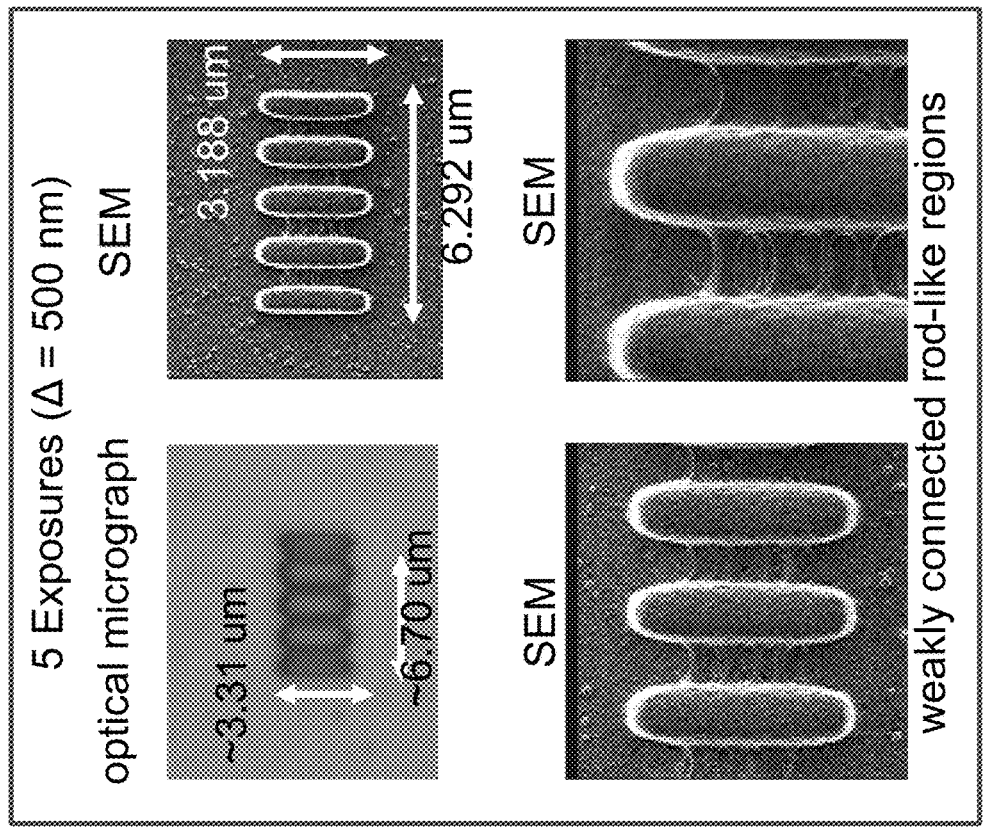

FIGS. 11A-11D are SEM images of crosslinked SU-8 photoresist features resulting from individual exposures of a square stylus or "pen" having different sizes in SU-8 photoresist down to sub-wavelength sizes, using an ASML stepper, subsequent to post-exposure baking and developing, according to an embodiment of the present disclosure. FIG. 11A shows a top view of a printed rod-like pen feature at 300 mJ/cm$^2$ FIG. 11B shows a side view of the printed rod-like pen feature at 300 mJ/cm$^2$. FIG. 11C shows a top view of a printed rod-like pen feature at 300 mJ/cm$^2$. FIG. 11D shows a zoomed out top view of the printed rod-like pen feature at 300 mJ/cm$^2$. FIG. 11E is an SEM image of ASML stepper printed stylus or "pen" features in SU-8 photoresist, according to an embodiment of the present disclosure. The designed printed square width is 1000 nm, the measured width value using SEM is 795 nm. The exposure dose is 300 mJ/cm$^2$. This image shows that, in some situations or conditions, diffraction of the pattern can cause the printed shapes to appear rounded even though the mask has a square pattern as shown in FIG. 11E.

FIGS. 12A-12F depict illumination configurations and SEM images of multi-exposure printing by using a piezo stage to move a wafer to create different overlap of exposed regions, according to an embodiment of the present disclosure. Using rod pen designed as 1.0μm×4.0 μm when printed, the rod pen is moved laterally as shown in FIGS. 12A, 12C and 12E. FIG. 12B is the image of the feature obtained with 7 exposures with a relative displacement between exposures of 0.5 μm (large overlap. FIG. 12D is the image of the feature obtained with 5 exposures with a relative displacement between exposures of 0.8 μm (med overlap). FIG. 12F is the image of the feature obtained with 4 exposures with a relative displacement between exposures of 1.0 μm (zero overlap). The third feature shown in FIG. 12F clearly shows full connectivity but also 3D features (i.e. regular corrugations) in the surface of the printed feature when zero overlap is used in successive exposures. Each of the features shown in FIGS. 12B, 12D and 12F is obtained using a plurality of exposures wherein each single exposure has a dose of 300 mJ/cm$^2$.

FIGS. 13A-13F depict an illumination configuration showing an adjustable separation Δ between edges of exposure rods, optical micrographs, and SEM images of multi-exposure printing by using a stepper's wafer piezo stage to move the wafer in order to create different separations between exposed regions that either overlap or do not overlap to make connected objects or features, according to an embodiment of the present disclosure. In an embodiment, using a rod pen designed as 1.0 μm×4.0 μm when printed at 5× reduction, the rod pen is moved at different amounts laterally between exposures of individual rod as shown. A fixed single exposure dose is approximately 300 mJ/cm$^2$. The symbol Δ corresponds to the theoretical separation between edges of individual rod exposures. Values of Δ that create well-connected objects are 0 nm, 100 nm, 250 nm. A value of Δ that creates weakly-connected objects is 500 nm. A value of Δ that does not create interconnected objects is 750 nm. Different separations between exposed regions can cause controlled corrugations in printed objects or features, as shown in enlarged images in FIGS. 13E and 13F.

FIGS. 14A-14D depict an illumination configuration, an SEM image, and two optical micrographs, of a particle composed of crosslinked SU-8 photoresist subsequent to multiple exposures of a rod pen when moved along a length of a 4 μm rod, according to an embodiment of the present disclosure. Areas having two overlapping exposures are thicker than areas having only a single exposure. The shape of final object or feature is controlled by relative amounts of displacements and exposures. For example, overlapping regions are wider than non-overlapping regions.

Figure 15B:
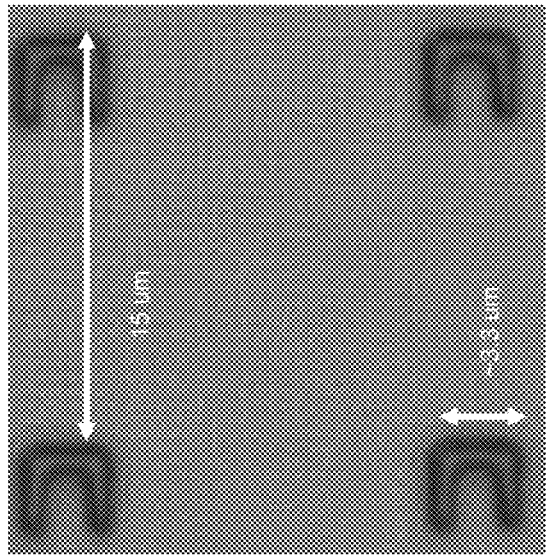
FIGS. 15A-15C depict an illumination configuration, an optical microscopy image, and an SEM image showing the creation of U-shapes using multiple overlapping exposures, according to an embodiment of the present disclosure.
Figure 15C:
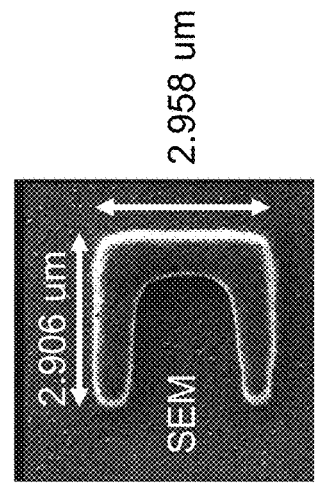
Figure 15A:
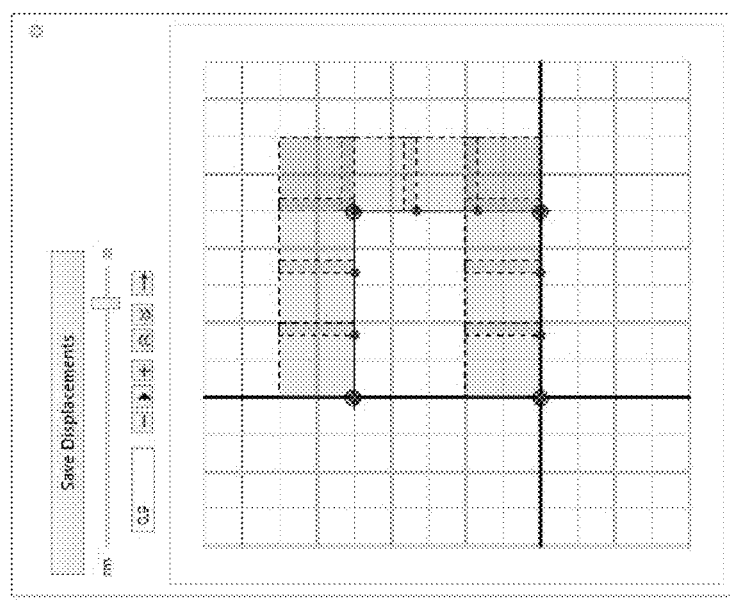

FIGS. 15A-15C depict an illumination configuration, an optical microscopy image, and an SEM image showing the creation of U-shapes using multiple overlapping exposures, according to an embodiment of the present disclosure. The features used to draw or print the U-shaped object or feature is a square pen with a side size of 1 μm. In order to create or print the U-shaped feature, the square pen is moved or translated while allowing the areas of successive exposures to overlap, as depicted in FIG. 15A.

Figure 16C:
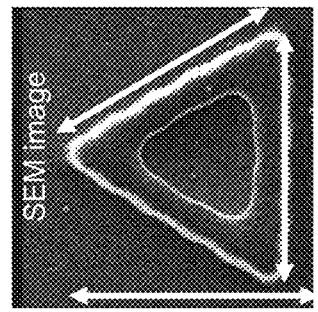
FIGS. 16A-16C depict an illumination configuration, an optical microscopy image, and an SEM image showing the creation of Δ-shapes (i.e. triangular prismatic toroids each having a central hole) using multiple overlapping exposures, according to an embodiment of the present disclosure.
Figure 16B:
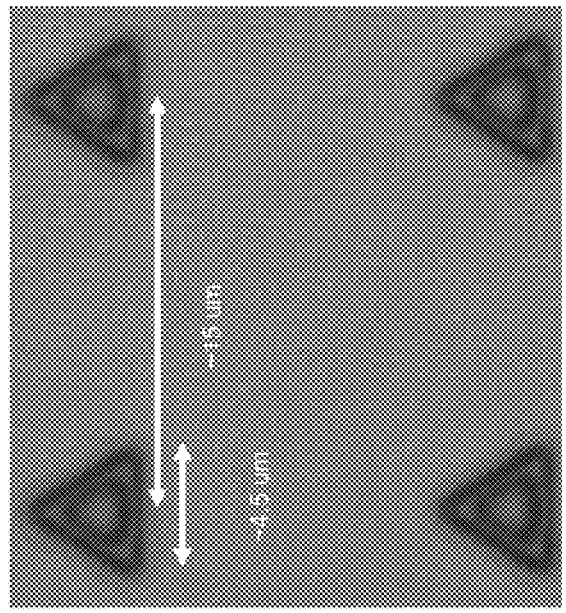
Figure 16A:
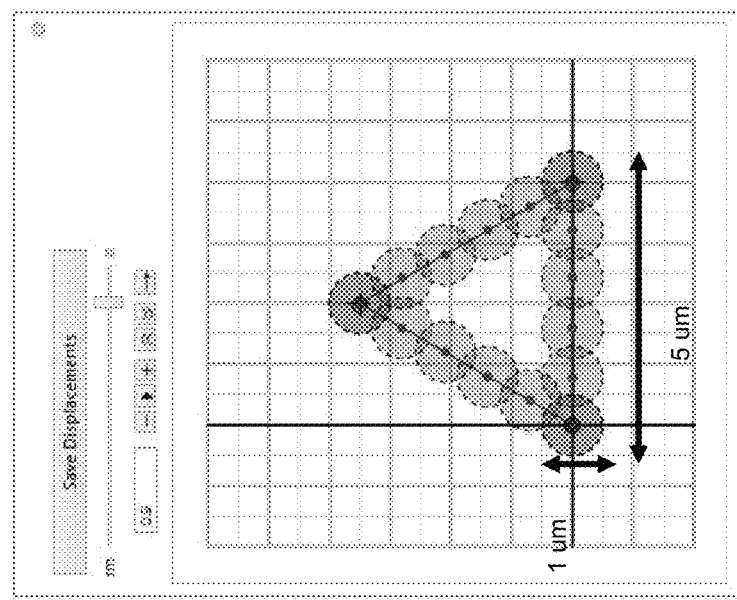

FIGS. 16A-16C depict an illumination configuration, an optical microscopy image, and an SEM image showing the creation of Δ-shapes (i.e. triangular prismatic toroids each having a central hole) using multiple overlapping exposures, according to an embodiment of the present disclosure. The features used to draw or print the Δ-shaped object or feature is a circular pen with a side size of 1 μm. In order to create or print the Δ-shaped feature, the circular pen is moved or translated while allowing the areas of successive exposures to overlap, as depicted in FIG. 16A.

Figures 17A, 17B:
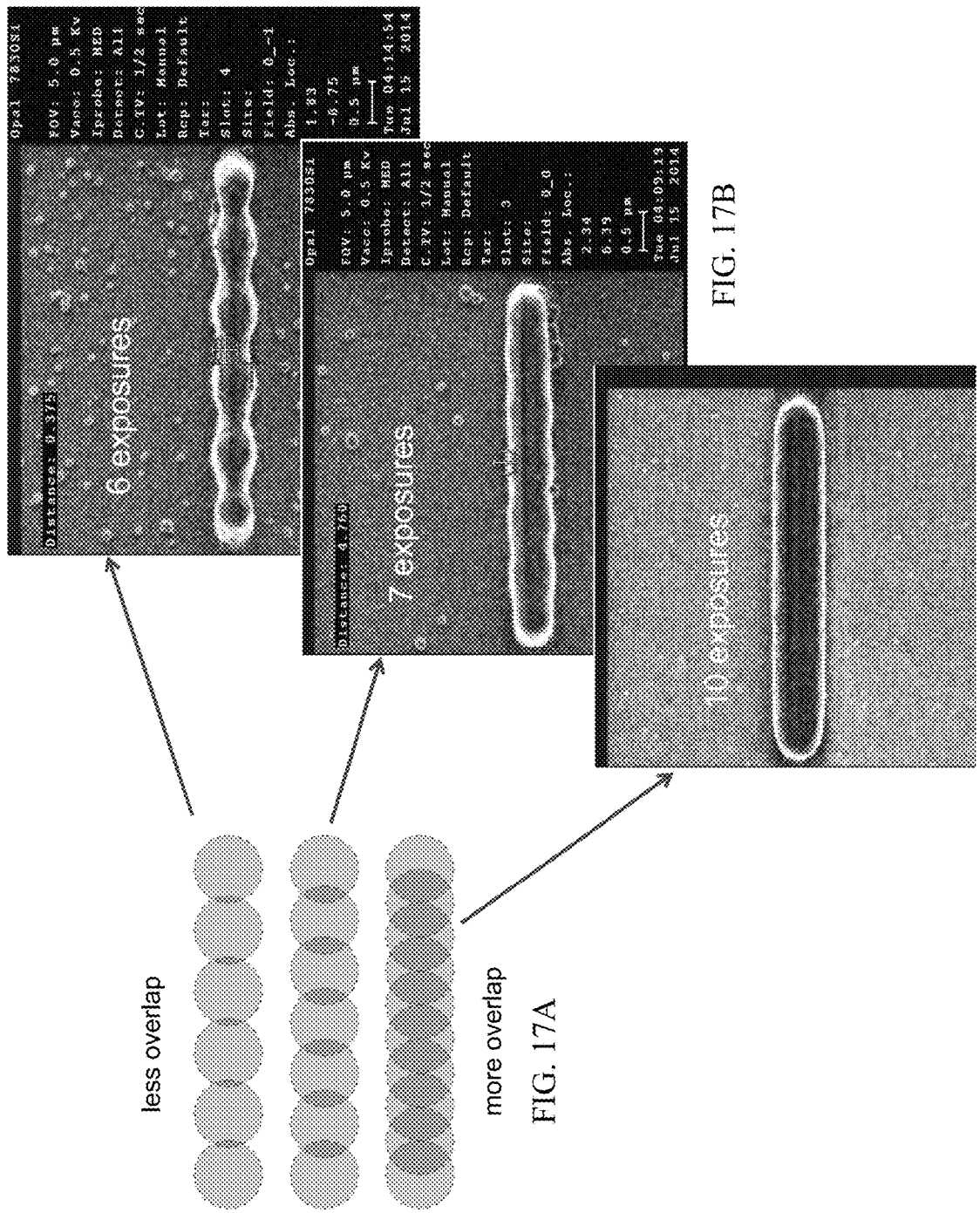
FIGS. 17A and 17B depict three different illumination configurations and three corresponding SEM images obtained using different numbers of multiple exposures (i.e. 6, 7, or 10 exposures) while moving or translating the exposure pen, according to an embodiment of the present disclosure.

FIGS. 17A and 17B depict three different illumination configurations and three corresponding SEM images obtained using different numbers of multiple exposures (i.e. 6, 7, or 10 exposures) while moving or translating the exposure pen, according to an embodiment of the present disclosure. The elongated shape shown in the consecutive SEM images are obtained using 6, 7 and 10 exposures, respectively. As shown, with 6 exposures the circular pens are less overlapped than when using 10 exposures. As a result, the obtained elongated shape exhibits curved ends and higher sub-particle edge corrugations when using lesser number of exposures. Indeed, with 10 exposures the elongated feature appears to be smoother overall and have smoother edges and well defined round ends.

Figures 18A, 18B, 18C, 18D:
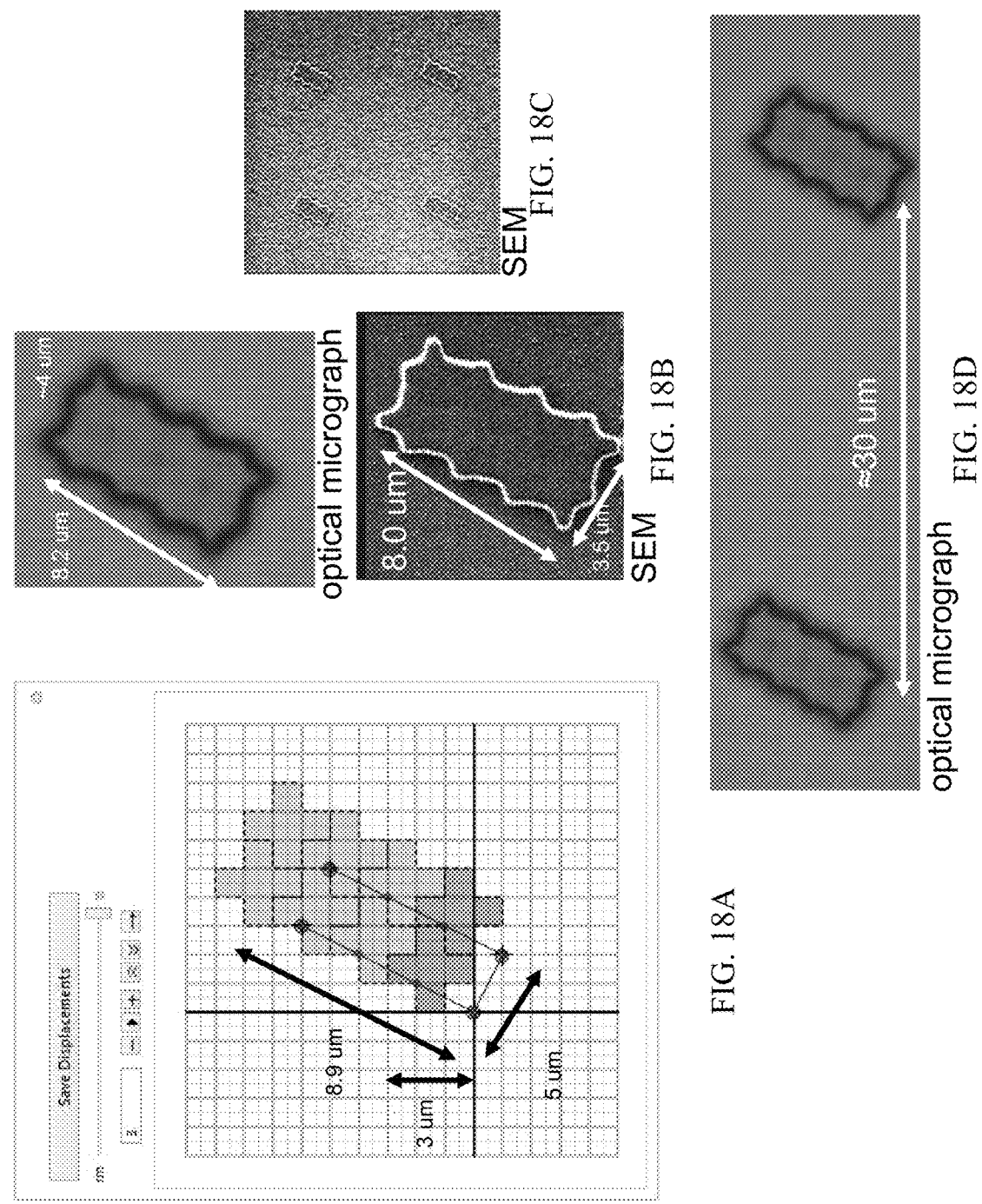
FIGS. 18A-18D depict an illumination configuration, optical microscopy images, and SEM images obtained using multiple exposures while moving or translating the exposure pen, according to an embodiment of the present disclosure.

FIGS. 18A-18D depict an illumination configuration, optical microscopy images, and SEM images obtained using multiple exposures while moving or translating the exposure pen, according to an embodiment of the present disclosure. The elongated shape shown in the SEM images are obtained using multiple zero or no overlap exposures of square cross or "+" pen. The end-to-end dimension of the square cross pen is 3 μm. The elongated feature is obtained by "tiling" the cross or "+" pen exposures, as shown in FIG. 18A.

Figure 19B:
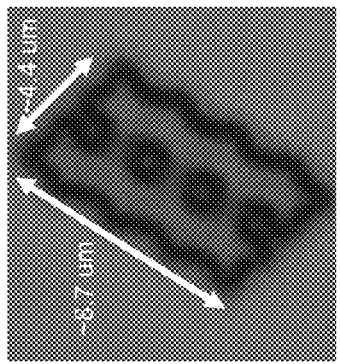
FIGS. 19A-19C depict an illumination configuration, an optical microscopy image, and an SEM image obtained using multiple exposures while moving or translating the exposure pen, according to an embodiment of the present disclosure.
Figure 19C:
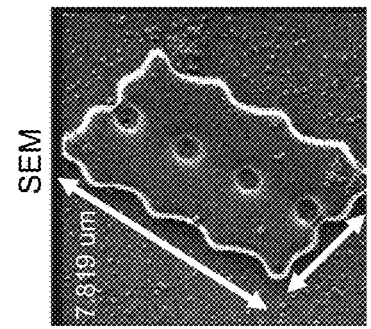
Figure 19A:
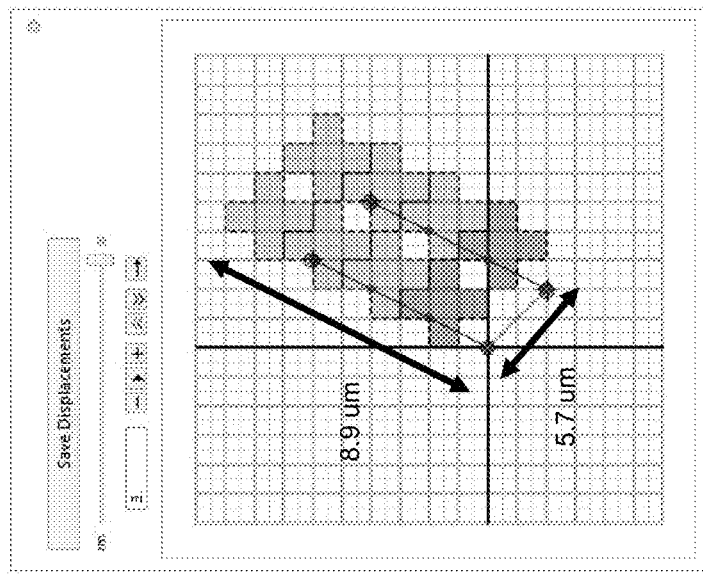

FIGS. 19A-19C depict an illumination configuration, an optical microscopy image, and an SEM image obtained using multiple exposures while moving or translating the exposure pen, according to an embodiment of the present disclosure. The elongated shape shown in the SEM images are obtained using multiple zero or no overlap exposures of cross or "+" pen. The dimension of the cross pen is 3 mm. The elongated particle is obtained by "tiling" the cross or "+" pen exposures while leaving holes therebetween, as shown in FIG. 18A. FIGS. 19B and 19C show the obtained printed elongated particle exhibiting holes within the particle. Nanoscale corrugations on side and top surfaces can be seen in the particle shown in FIGS. 19B and 19C.

Figure 20A:
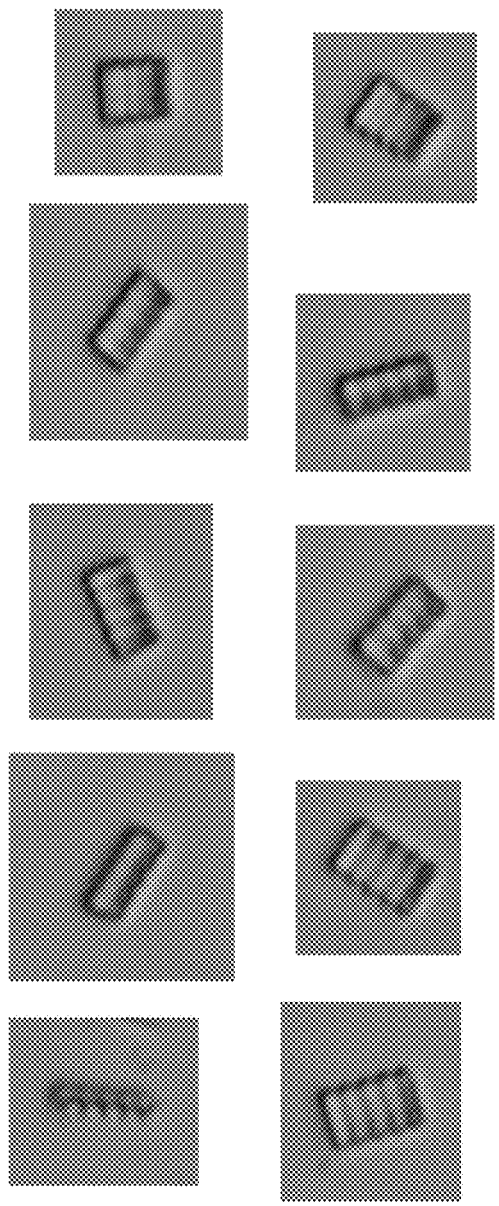
FIGS. 20A-20C depict transmission optical microscopy images of crosslinked SU-8 particles subsequent to release into an aqueous solution of sodium dodecyl sulfate, an illumination configuration, and an SEM image. The crosslinked SU-8 particles are obtained using multiple exposures while moving or translating the exposure pen, according to an embodiment of the present disclosure.
Figure 20C:
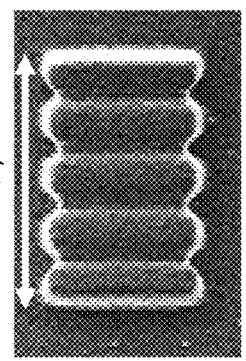
Figure 20B:
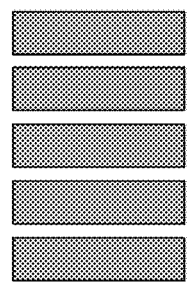

FIGS. 20A-20C depict transmission optical microscopy images of crosslinked SU-8 particles subsequent to release into an aqueous solution of sodium dodecyl sulfate, an illumination configuration, and an SEM image. The crosslinked SU-8 particles are obtained using multiple exposures while moving or translating the exposure pen, according to an embodiment of the present disclosure. FIG. 20A show optical micrographs of released non-overlapping $\Delta=250$ nm of five-rod exposure platelets. The exposed SU-8 particles are released from wafer substrate into an aqueous surfactant solution. After development of SU-8, release was performed with TMAH basic solution to dissolve 120 nm thick LOR1A release layer under 1 μm thick SU-8 photoresist layer. In one embodiment, the surfactant used is sodium dodecyl sulfate (SDS) with a 10 mM concentration in water. The surfactant inhibits particle agglomeration after release and lift-off into the aqueous solution by adsorbing onto the surfaces of the particles (Debye-screened repulsion). As shown in FIG. 20A, sub-particles 3D features can be observed. FIG. 20B shows the illumination pattern as being a commanded set of non-overlapping exposures with a translation $\Delta$ of 250 nm. FIG. 2C shows the obtained printed features having solid bridging interconnections which yield a single solid object that has 3D structure. Corrugations on side and top surfaces can be seen in the feature shown in the SEM image of FIG. 20C.

Figure 21B:
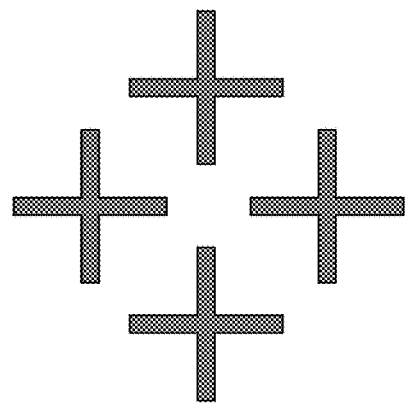
FIGS. 21A and 21B show an optical microscopy image of the resulting regions of crosslinked SU-8 photoresist, subsequent to post-exposure baking and developing, and an illumination pattern, respectively, for a single exposure of a mask that contains a relatively high density array of thin square cross-pens, according to an embodiment of the present disclosure.
Figure 21A:
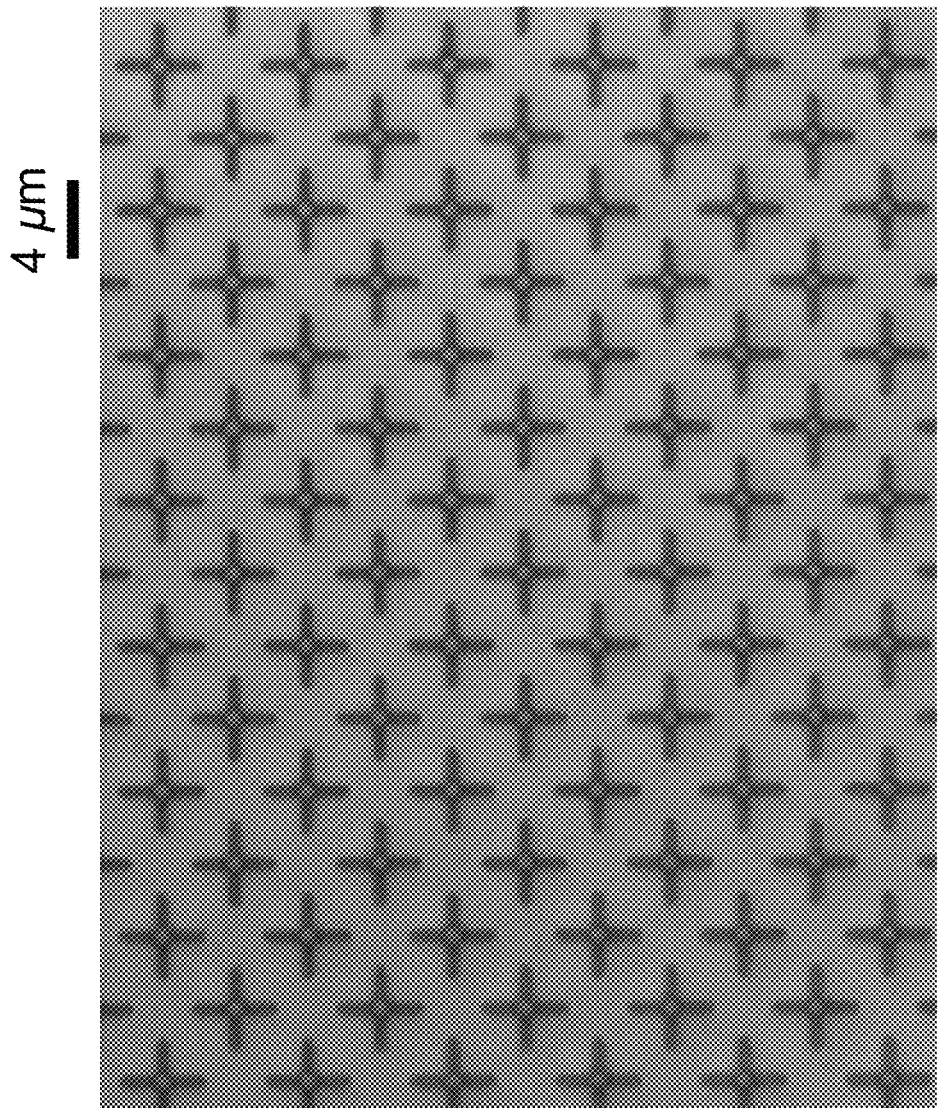

FIGS. 21A and 21B show an optical microscopy image of the resulting regions of crosslinked SU-8 photoresist, subsequent to post-exposure baking and developing, and an illumination pattern, respectively, for a single exposure of a mask that contains a relatively high density array of thin square cross-pens, according to an embodiment of the present disclosure. FIG. 21B depicts the array of thin square cross-pens on photomask and FIG. 21A depicts the obtained features after exposure, bake and development of the SU-8 photoresist layer deposited on a release layer on a Si wafer substrate. As shown in FIG. 21A, a single exposure yields an array of square cross-shapes.

Figure 22A:
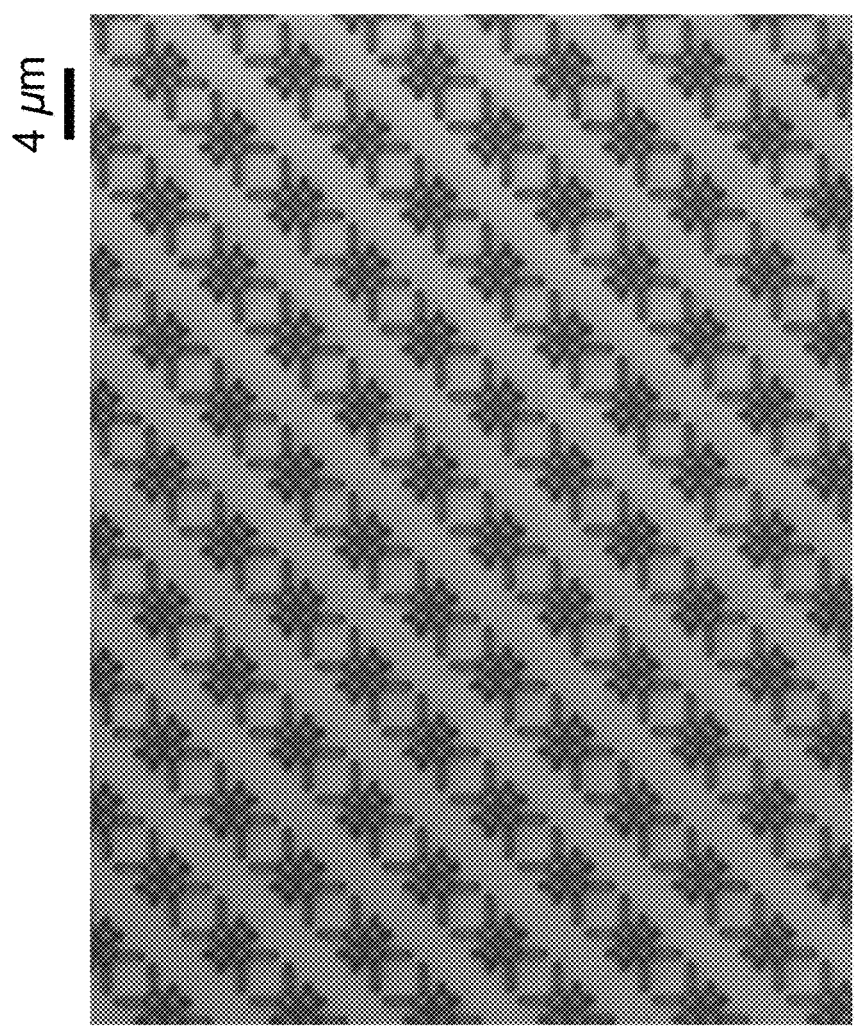
FIGS. 22A and 22B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure.
Figure 22B:
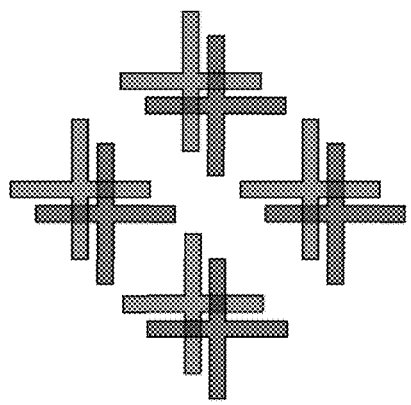

FIGS. 22A and 22B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure. FIG. 22B depicts two arrays of thin square cross-pens on photomask with one array shifted relative to the other. The first array corresponds to a first exposure and the second array corresponds to a second exposure. The second exposure is performed after shifting in both x and y directions relative to the position of the first array in the first exposure. FIG. 22A depicts the obtained features after exposure, bake and development of the SU-8 photoresist layer deposited on a release layer on a Si Wafer substrate. The features or particles can be subsequently lifted off of the wafer into a liquid to form a dispersion. This shows an example of a fabrication of diagonal square cross dimer particles.

Figure 23B:
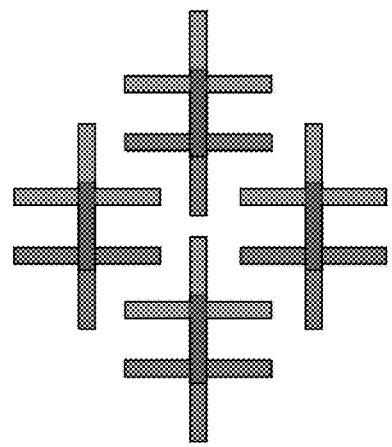
FIGS. 23A and 23B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure.
Figure 23A:
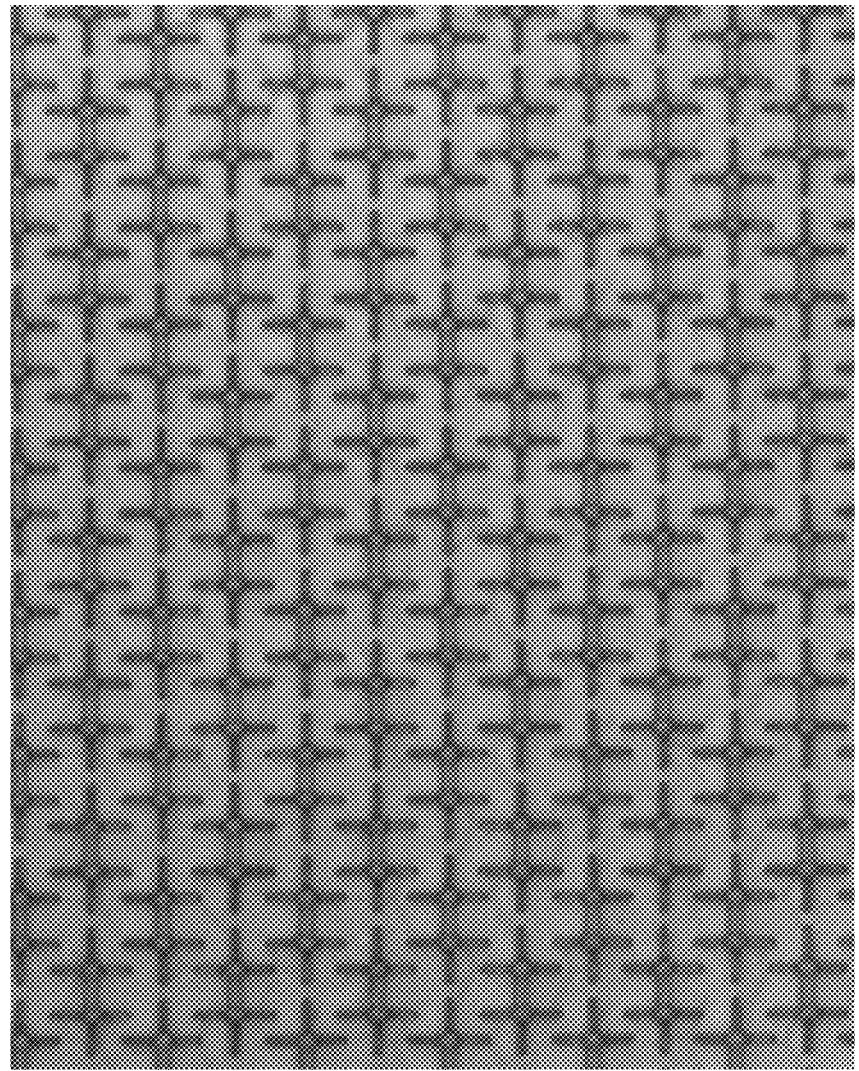

FIGS. 23A and 23B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure. FIG. 23B depicts two arrays of thin square cross-pens on photomask with one array shifted relative to the other. The first array corresponds to a first exposure and the second array corresponds to a second exposure. The second exposure is performed after shifting in the x direction relative to the position of the first array in the first exposure. FIG. 23A depicts the obtained features after exposure, bake and development of the SU-8 photoresist layer deposited on a release layer on a Si Wafer substrate. The features or particles can be subsequently lifted off of the wafer into a liquid to form a dispersion. This shows an example of a fabrication of linear square cross dimer particles.

Figures 24A, 24B:
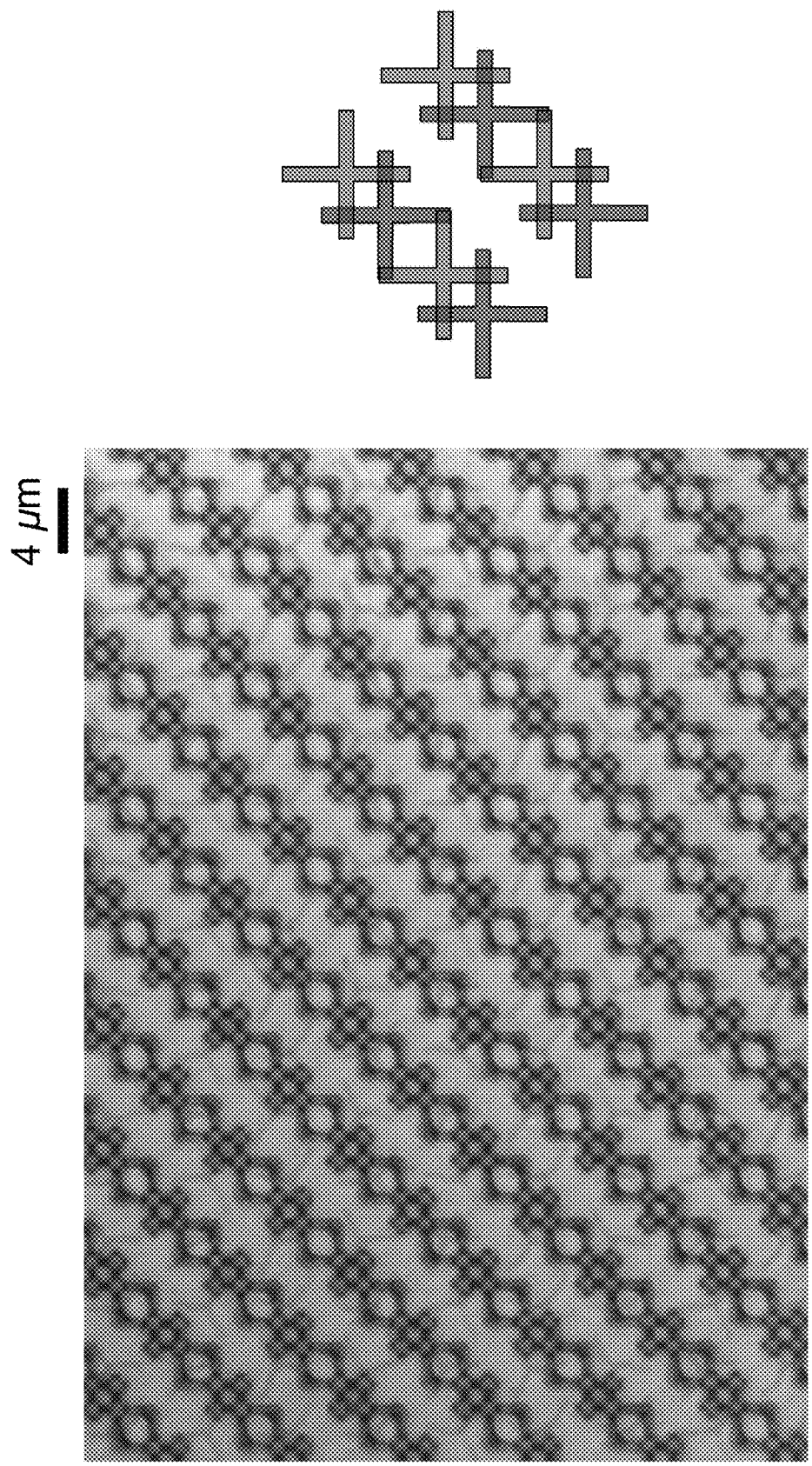
FIGS. 24A and 24B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure.

FIGS. 24A and 24B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure. FIG. 24B depicts two arrays of thin square cross-pens on photomask with one array shifted relative to the other. The first array corresponds to a first exposure and the second array corresponds to a second exposure. The second exposure is performed after shifting in both the x and y directions relative to the position of the first array in the first exposure. FIG. 24A depicts the obtained features after exposure, bake and development of the SU-8 photoresist layer deposited on a release layer on a Si Wafer substrate. The features or particles can be subsequently lifted off of the wafer into a liquid to form a dispersion. The shift of the mask yields an interconnected patterned strips that are quasi-one-dimensional. This shows an example of a fabrication of an interconnected patterned strips using a mask containing a dense pattern of thin square crosses.

Figure 25B:
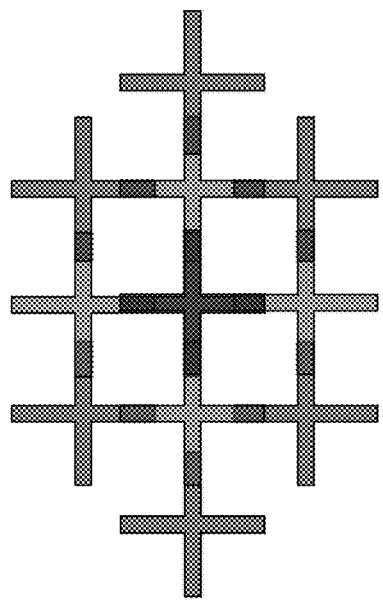
FIGS. 25A and 25B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure.
Figure 25A:
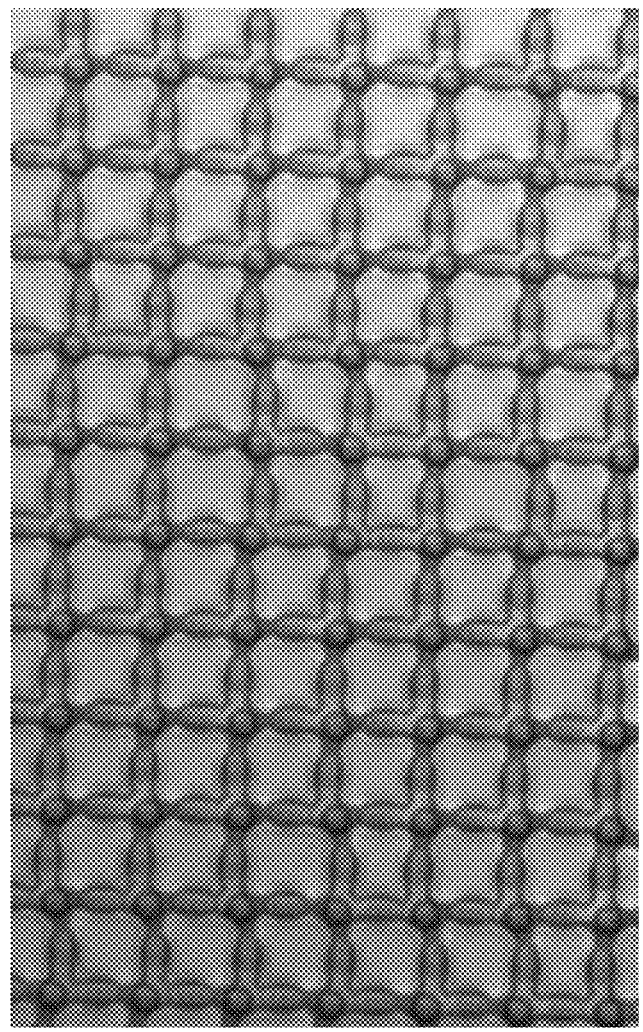

FIGS. 25A and 25B show an optical microscopy image of the resulting regions of crosslinked SU-8 photoresist, subsequent to post-exposure baking and developing, and an illumination pattern, respectively, for a double exposure of a mask that contains a relatively high density array of thin square cross-pens, according to an embodiment of the present disclosure. FIG. 25B depicts two arrays of thin square cross-pens on photomask with one array shifted relative to the other. The first array corresponds to a first exposure and the second array corresponds to a second exposure. The second exposure is performed after shifting in both the x direction relative to the position of the first array in the first exposure. FIG. 25A depicts the obtained features after exposure, bake and development of the SU-8 photoresist layer deposited on a release layer on a Si wafer substrate. The shift of the mask yields an interconnected porous patterned film that is two-dimensional and is subsequently lifted off from the wafer in a liquid. This shows an example of a fabrication of an interconnected porous two-dimensional film using a mask containing a dense pattern of thin square crosses.

FIGS. 26A-26F show various SEM images and their corresponding illumination patterns for rod-like pens having different separations in each illumination pattern, according to various embodiments of the present disclosure. FIG. 26A depicts an SEM image with features on SU-8 photoresist obtained after exposure to overlapping exposures. FIG. 26B depicts an SEM image with features on SU-8 photoresist obtained after exposure to tiling or juxtaposed (i.e., nearly touching) exposures ($\Delta=0$ nm). The SEM image shows that solid bridging interconnections yield a single solid object that has 3D structure with corrugations on the side and top surfaces of the structure. FIG. 26C depicts an SEM image with features on SU-8 photoresist obtained after exposure to non-overlapping exposures ($\Delta$=100 nm). The SEM image shows that solid bridging interconnections yield a single solid object that has 3D structure with corrugations on the side and top surfaces of the structure. FIG. 26D depicts an SEM image with features on SU-8 photoresist obtained after exposure to non-overlapping exposures ($\Delta$=250 nm). The SEM image shows that solid bridging interconnections yield a single solid object that has 3D structure with corrugations on the side and top surfaces of the structure. FIG. 26E depicts an SEM image with features on SU-8 photoresist obtained after exposure to non-overlapping exposures ($\Delta$=500 nm). The SEM image shows a 3D structure with fine bridging interconnections. FIG. 26F depicts an SEM image with features on SU-8 photoresist obtained after exposure to non-overlapping exposures ($\Delta$=750 nm). The SEM image shows separate rods with substantially no interconnections. FIGS. 26A-F show that non-overlapping exposures can create interconnected objects having 3D features that are related to stylus (pen) shape and the relative position of the exposures.

Figure 27:
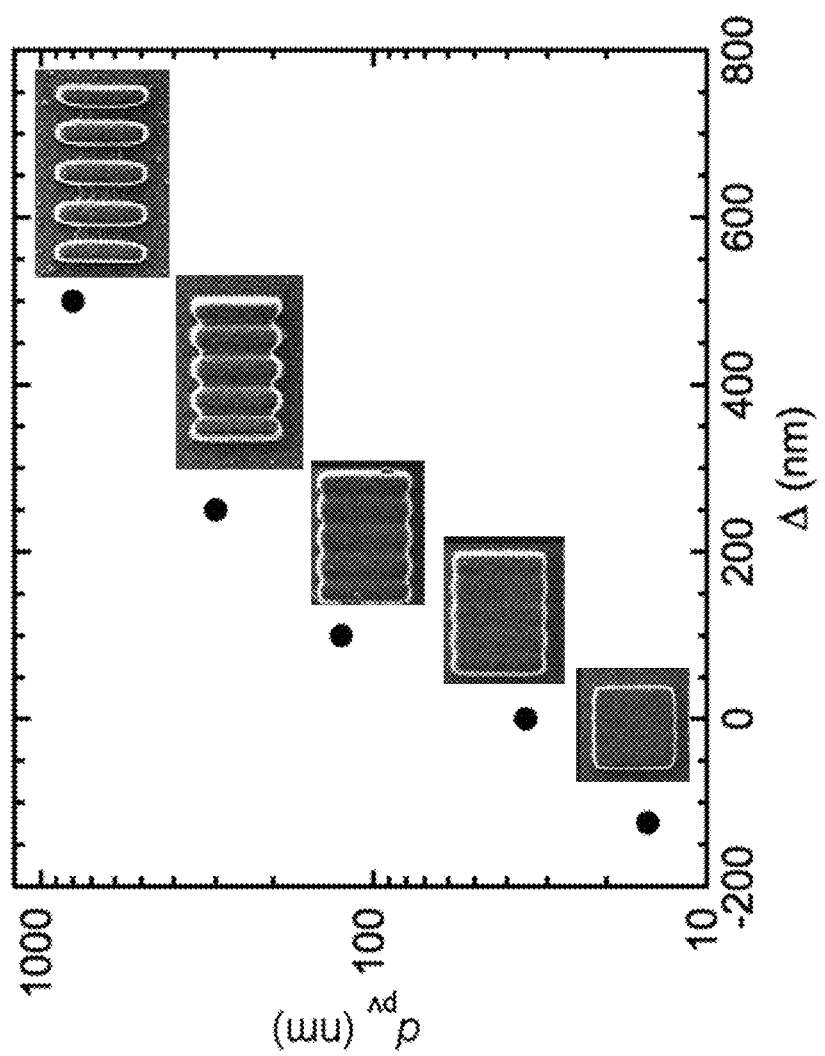
FIG. 27 is a plot of a measured peak-to-valley distance (i.e., amplitude) $d_{pv}$ of corrugations on edges of particles from SEM images versus a distance of separation $\Delta$ between the edges of adjacent exposures of a rod stylus, according to an embodiment of the present disclosure.

FIG. 27 is a plot of a measured peak-to-valley distance (i.e., amplitude) $d_{pv}$ of corrugations on edges of particles from SEM images versus a distance of separation $\Delta$ between the edges of adjacent exposures of a rod stylus, according to an embodiment of the present disclosure. Examining particles produced by five separate exposures of a 4 µm×1 µm rod-shaped stylus, the peak-to-valley separation (i.e. amplitude) $d_{pv}$ of the structured undulations on the edges of the particles are measured and are plotted as a function of separation distance $\Delta$. The separation distance $\Delta$ is defined as the separation between ideal edges of the exposure of the 4 µm×1 µm rod-shaped stylus. Therefore, positive values of $\Delta$ represent non-overlapping exposures in an ideal sense, whereas a zero value of $\Delta$ represents exposures that just fill space, and negative values of $\Delta$ represent exposures that overlap by an amount |$\Delta$|. The plot in FIG. 27 shows that, as $\Delta$ is increased, the amplitude of the undulations also increases. At $\Delta$=750 nm where the 5 successive exposures of rods no longer interconnect to form a particle resulting from the combined pattern of exposures, the amplitude $d_{pv}$ does not have meaning so no value is reported. This plot further shows that the amplitude of undulations on the edges of resulting particles can be controlled to nanoscale resolution. Note that these undulations only appear on two opposite edges. The other two edges are smoother, so the nanoscale corrugations can be placed on specific edges of particles as controlled by the shape of the stylus beam and the relative displacements of a set of discrete exposures.

Figure 28A:
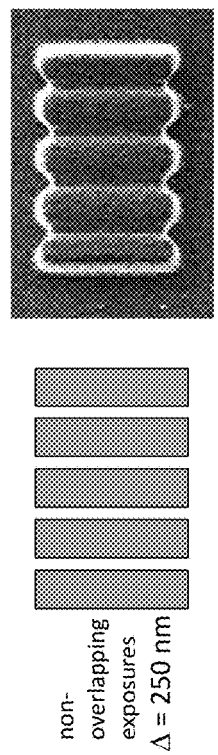
FIGS. 28A-28E show an illumination pattern of five exposures having $\Delta=250$ nm, an SEM image (top view) of a particle of crosslinked SU-8 produced by this illumination pattern, and various SEM images providing various views of particles obtained with rod shifted stylus (pen) exposures, according to an embodiment of the present disclosure.
Figure 28C:
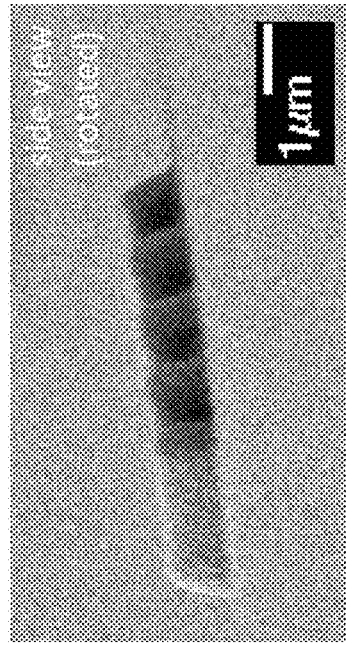
Figure 28B:
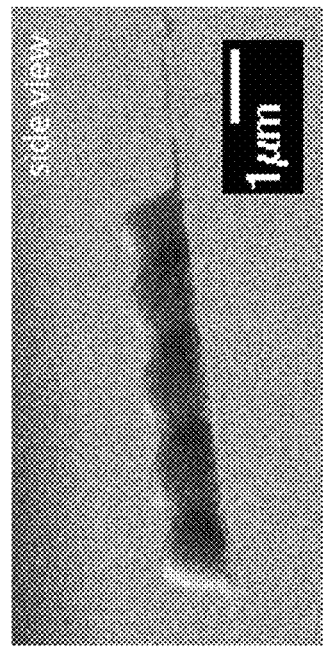
Figure 28E:
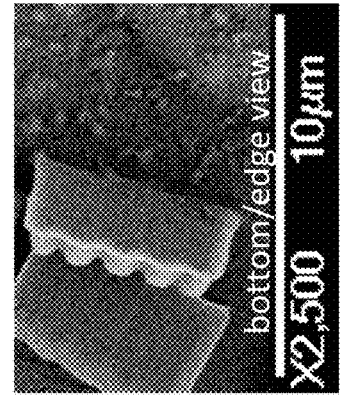
Figure 28D:
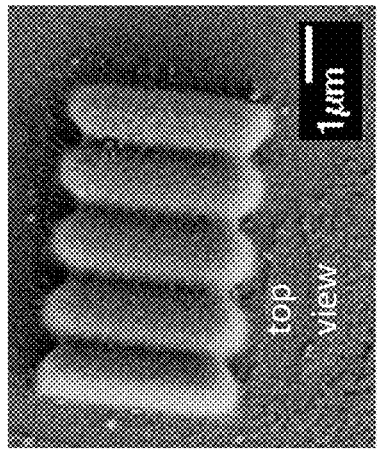

FIGS. 28A-28E show an illumination pattern of five exposures having $\Delta$=250 nm, an SEM image (top view) of a particle of crosslinked SU-8 produced by this illumination pattern, and various SEM images providing various views of particles obtained with rod shifted stylus (pen) exposures, according to an embodiment of the present disclosure. As shown in FIG. 28A, the exposures are non-overlapping and the separation distance $\Delta$ between the exposures is equal to 250 nm. FIGS. 28A-28E shows that obtained particle or feature has a corrugated top surface. The obtained particle is also corrugated at two opposite lateral surfaces.

In an embodiment of the current invention, particles made using multiple exposures to create anisotropic surface corrugations are combined with a depletion agent to produce an anisotropic shape-controlled or roughness-controlled depletion attraction that causes selective surfaces of two or more particles to become attracted together in a prespecified manner. In an embodiment of the current invention, the addition of a depletion agent to a dispersion of particles produced by the herein described method causes a desired assembly of attractive particles to form, wherein the assembly is controlled by an anisotropic depletion attraction that is sensitive to nanoscale surface structures (e.g. corrugations) that have been purposefully designed into the particles through control over the shape of light-stylus beams, the energy does per exposure, the type of photosensitive material used, and the relative positions of the exposures.

In some embodiments, in order to achieve the desirable level of control, temperature of the environment containing the mask and the substrate is also controlled along with the positioning systems.

In an embodiment of the current disclosure, the beams of light that have been structured by the transparent non-blocking stylus shapes in the mask are focused onto a layer of photosensitive material, thereby causing a reduction in the sizes of the exposed regions of photosensitive material compared to the sizes of the stylus shapes on the mask. For example, if a 5× reduction stepper is utilized, then the structured beams of light are actually focused onto the photoresist to provide a 5× reduction in the ideal sizes of the exposed regions. The degree of optical diffraction of such focused structured light beams can differ from the degree of diffraction related to collimated structured light beams.

Overlapping regions of exposure can create wider features in-plane through the dose-response nature of the photoresist, thereby locally increasing the in-plane widths of portions of the particles in regions where two or more overlapping exposures have occurred. To achieve this effect, the dose of an individual exposure can be adjusted to be above the lower threshold dose necessary to achieve at least some crosslinking of the photoresist in the central areas of exposed regions but not at the edges of exposed regions based on only a single exposure, but below the upper threshold dose that is related to saturation of the photochemical effects, so that there is no change in the crosslinking of the edge region above that upper threshold dose.

As it must be appreciated from the above paragraphs, instead of making 3D particle shapes using multiple exposures of a plurality of layers of photoresist that are deposited successively, 3D particle shapes are made using a single layer of photoresist through a control of a relative positioning of two or more exposures (a plurality of exposures) with controlled doses, delivered by the light stylus pens. Such sub-particle geometrical features (e.g. corrugations, holes, protrusions, indentations, ridges, troughs, undulations, and asperities), whether in-plane, out-of-plane, or a combination thereof, can be controlled to make complex 3D shapes can be created by using nanopositioning, diffraction, and the dose-crosslinking response of the photoresist. The final 3D shapes and sizes of the resulting particles typically do not resemble the simple 2D shapes and sizes of the light stylus pens. The feature of subjecting a single resist layer to multiple light exposures while controlling the positioning of the resist layer, the dimensions of the stylus features (thus diffraction) and the dose delivered by the light stylus to the resist layer to create desired 3D shapes is novel.

In addition, as it must be appreciated from the above paragraphs, diffraction can cause non-overlapping exposures of the light stylus that are proximately located and finely controlled by a nanopositioning stage to effectively link these non-overlapping regions together in-plane. The non-overlapping exposures are typically separated by no more than about 2 wavelengths of light. Providing that the non-overlapping exposures be separated by a dimension less than or equal to 2 wavelengths of light allows light to extend beyond the regions of intended exposure to cause crosslinking of the photoresist in the non-overlapping regions between the two exposures. Otherwise, if the non-overlapping exposures are separated by a dimension more than 2 wavelengths, the diffraction does not cause enough light to extend beyond the regions of intended exposure to cause crosslinking of the photoresist in the non-overlapping regions between the two exposures. Therefore, in the present disclosure, rather than ignoring diffraction as an artifact that is to be avoided in lithography, instead diffraction is used to crosslink regions of photoresist between non-overlapping exposures in-plane. For example, the photosensitive material in between the two designed exposed regions becomes crosslinked by the diffracted light, thereby connecting the regions of non-overlapping exposures together after appropriate post-exposure baking and development.

Furthermore, as it must be appreciated from the above paragraphs, in the case of non-overlapping exposures, corrugations and structures out-of-the-plane can be created on top surfaces of particles produced using non-overlapping exposures. This means that various 3D aspects of a shape of a particle can be controlled through the degree of separation between non-overlapping exposures and delivered doses of light stylus pens. This control is not limited to just in-plane aspects of the particle shape but can also encompass top surface control of the shape (as illustrated for example in FIGS. 13A-13D, FIGS. 26A-26F, or FIGS. 28A-28E). For instance, top surfaces of the particles can be corrugated with a periodic pattern of undulations, whereas the bottom surfaces of the particles can be substantially flat and may not have such undulations.

In an embodiment, the target material can be composed of at least a photoresist that includes compatible additives that can be incorporated into it and provide additional functionality to the released particles. Examples of such additives include but are not limited to: fluorescent dye molecules (e.g., Nile red or Alexa dyes to confer fluorescent optical properties); nanoparticles (e.g. iron oxide nanoparticles or organically-coated iron oxide nanoparticles to confer magnetic properties; inorganic nanoparticles such as silica nanoparticles; polymer nanoparticles such as polystyrene nanoparticles; carbon nanotubes; graphene nanoparticles; graphene oxide nanoparticles; clay or other plate-like nanoparticles; photonic nanoparticles; metal nanoparticles; metal-oxide nanoparticles; quantum dots; lithographic nanoparticles); microscale, sub-microscale, and nanoscale liquid droplets (e.g. nanoemulsion droplets containing liquids such as water or oil); microscale, sub-microscale, and nanoscale droplets of a liquid crystal; nutrient molecules; sugar molecules; starch molecules; fatty molecules; amphiphilic molecules; antimicrobial molecules; antimicrobial nanoparticles; drug molecules; biopolymer molecules; acidic molecules; basic molecules; DNA molecules; RNA molecules; poly-peptide molecules; poly-ribonucleic acid molecules; radioactive nanoparticles, radioactive molecules; biodegradable molecules; biodegradable nanoparticles; metabolizable molecules; and metabolizable nanoparticles.

In an embodiment, the target material is a photopolymerizable material that can be broken down by biochemical processes such as biodegradation, metabolic activity, enzyme activity, and digestive activity. In an embodiment, the target material is a photopolymerizable material that is biocompatible with mammalian organisms. In an embodiment, the target material is a photopolymerizable material that is a biopolymeric material. In an embodiment, the target material is a photopolymerizable material that is an optically anisotropic material.

In an embodiment, the surfaces of the particles can be treated in a manner to achieve stabilization against aggregation when the particles are dispersed in a liquid material. As an example, release of SU-8 particles from the substrate into an aqueous solution containing dissolved surfactant sodium dodecyl sulfate can confer stability against aggregation that enables the particles to be homogeneously dispersed.

In an embodiment, the surfaces of the particles can be treated in a manner to achieve different desired molecular coatings or surface roughness over portions of the surfaces of the particles to confer properties that can serve to guide later self-assembly subsequent to release.

REFERENCES

Madou, M. J. *Fundamentals of Microfabrication and Nanotechnology*, Third Edition, Volumes 1,2, and 3, CRC Press (2011).

Massively Parallel Assembly of Composite Structures using Depletion Attractions. T. G. Mason. U.S. Pat. No. 9,051,176. Issued: Jul. 9, 2015. Based on U.S. patent application Ser. No. 12/524,946.

Process for Creating Shape Designed Particles in a Fluid. T. G. Mason. U.S. Pat. No. 9,090,860. Issued: Jul. 28, 2015. Based on U.S. patent application Ser. No. 12/575,920.

Customized Lithographic Particles. T. G. Mason and C. J. Hernandez. U.S. Pat. No. 8,617,798. Issued: Dec. 31, 2013. Based on U.S. patent application Ser. No. 12/377,773.

Mechanical Process for Producing Particles in a Fluid. T. G. Mason. U.S. Pat. No. 8,562,892. Issued: Oct. 22, 2013. Based on U.S. patent application Ser. No. 12/579,226.

Process for Sorting Dispersed Colloidal Structures. T. G. Mason. U.S. Pat. No. 8,377,307. Issued: Feb. 19, 2013. Based on U.S. patent application Ser. No. 12/576,089.

Process for Directing Assemblies of Particulate Dispersions Using Surface Roughness. T. G. Mason and K. Zhao. U.S. Pat. No. 8,193,102. Issued: Jun. 5, 2012. Based on U.S. patent application Ser. No. 12/739,697.

Osmotically Driven Shape Dependent Colloidal Separations, T. G. Mason, *Phys. Rev. E Rapid Comm.* 66, 060402/1-4 (2002).

The embodiments illustrated and discussed in this specification are intended only to teach those skilled in the art how to make and use the invention. In describing embodiments of the disclosure, specific terminology is employed for the sake of clarity. However, the disclosure is not intended to be limited to the specific terminology so selected. The above-described embodiments of the disclosure may be modified or varied, without departing from the invention, as appreciated by those skilled in the art in light of the above teachings. It is therefore to be understood that, within the scope of the claims and their equivalents, the invention may be practiced otherwise than as specifically described. For example, it is to be understood that the present disclosure contemplates that, to the extent possible, one or more features of any embodiment can be combined with one or more features of any other embodiment.

We claim:

1. A method of producing sub-millimeter scale particles, comprising:

providing a substrate that has a layer of photosensitive material thereon;

exposing a portion of said layer of photosensitive material to a structured beam of light that has a preselected cross-sectional shape, a preselected cross-sectional size, a preselected wavelength, a preselected intensity of exposure, and a preselected duration of exposure, wherein said preselected cross-sectional size of said structured beam of light at the layer of photosensitive material is smaller than a sub-millimeter scale particle being produced by said exposing, and wherein said layer of photosensitive material has a preselected photoresponse to said structured beam of light;

moving at least one of said substrate or said beam of light relative to each other to follow a preselected path for making at least one of additional exposures or continuous exposure to result in a discrete exposed pattern in said layer of photosensitive material that corresponds to said sub-millimeter scale particle being produced;

further exposing said layer of photosensitive material to said structured beam of light at least one of continuously or at multiple points along said preselected path; and processing said layer of photosensitive material subsequent to said exposing, said moving and said further exposing to remove unexposed material around said discrete exposed pattern in said layer of photosensitive material and to separate said discrete exposed pattern from said layer of photosensitive material and from said substrate to provide said sub-millimeter scale particle.

2. The method according to claim 1, wherein said further exposing said layer of photosensitive material to said beam of light is further exposing at multiple points along said preselected path, and wherein said cross-sectional shape, cross-sectional size, intensity of exposure, duration of exposure, position of each exposure along said path, diffraction of said structured beam of light, degree of focusing of said structured beam of light at said layer of photosensitive material during each exposing, and said processing are all controlled or taken into account to provide said sub-millimeter scale particle with a predetermined shape and surface structure.

3. The method according to claim 2, wherein said sub-millimeter scale particle is produced with predetermined substructures that are smaller than said preselected wavelength of said beam of light.

4. The method according to claim 2, wherein said exposing said portion of said layer of photosensitive material to said beam of light is exposing said portion of said layer of photosensitive material to a plurality of beams of light each having a preselected cross-sectional shape, a preselected cross-sectional size, a preselected intensity of exposure, and a preselected duration of exposure for producing a plurality of sub-millimeter scale particles in parallel, wherein said cross-sectional size of each of said plurality of beams of light is smaller than a corresponding sub-millimeter scale particle being produced by said exposing.

5. The method according to claim 1, wherein said exposing said portion of said layer of photosensitive material to said beam of light is exposing said portion of said layer of photosensitive material to a plurality of beams of light each having a preselected cross-sectional shape, a preselected cross-sectional size, a preselected intensity of exposure, and a preselected duration of exposure for producing a plurality of sub-millimeter scale particles in parallel, wherein said cross-sectional size of each of said plurality of beams of light is smaller than a corresponding sub-millimeter scale particle being produced by said exposing.

6. The method according to claim 5, wherein said moving at least one of said substrate or said beam of light relative to each other is moving said substrate.

7. The method according to claim 6, wherein said moving said substrate comprises moving said substrate to within a precision of at least ±5 nm in at least two degrees of freedom.

8. The method according to claim 1, wherein said sub-millimeter scale particle is produced with predetermined substructures that are smaller than said preselected wavelength of said beam of light.

9. The method according to claim 1, further comprising diffracting light incident upon a mask by transmitting areas within said mask to form a diffracted beam of light such that the diffracted beam of light has a size greater than a size of said transmitting area.

10. The method according to claim 9, further comprising moving said layer of photosensitive material such that the photosensitive material in between the two designed exposed regions becomes crosslinked by the diffracted structured beam of light, thereby connecting regions of non-overlapping exposures together.

11. The method according to claim 10, further comprising controlling, by a spacing between exposures, at least one of in-plane and out-of-plane sub-particle nanoscale features.

12. The method according to claim 10, wherein the at least two non-overlapping exposures are separated by less than or equal to two wavelengths of the light so as that the diffracted beams of light extend beyond the at least two non-overlapping exposures to cause crosslinking in the layer of photosensitive material between the at least two non-overlapping exposures.

13. The method according to claim 1, imparting a sub-particle geometrical feature by a mask such that a shape of said structured beam of light having the preselected cross-sectional shape and the preselected cross-sectional size is different from a shape of a final particle produced.

14. A plurality of sub-millimeter particles produced according to the method of claim 1.

15. A system for producing sub-millimeter scale particles, comprising:

a movable stage;

a light exposure system arranged to expose a layer of photosensitive material on a substrate to a beam of light when held on said movable stage, said light exposure system comprising:

a light source that provides light at an exposure wavelength, a mask arranged in an optical path of said light source, said mask having at least one light transmitting area surrounded by light blocking areas so as to form said beam of light from said light source, said beam of light having a preselected cross-sectional shape and a preselected cross-sectional size, and a light control system configured to control operation of said exposure system to at least turn said beam of light on and off at specific times during operation; and a stage control system arranged to communicate with said movable stage to cause said stage to move along a predetermined path corresponding to a sub-millimeter scale particle being produced, wherein said preselected cross-sectional size of said beam of light is smaller than said sub-millimeter scale particle being produced.

16. The system for producing sub-millimeter scale particles according to claim 15, wherein said mask has a plurality of light transmitting areas, each surrounded by light blocking areas so as to form a plurality of beams of light from said light source, each beam of light of said plurality of beams of light having a preselected cross-sectional shape and a preselected cross-sectional size such that a plurality of particles can be produced in parallel while said movable stage is moved.

17. The system for producing sub-millimeter scale particles according to claim 15, wherein said stage control system causes said movable stage to move with a precision of at least ±5 nm in at least two dimensions.

18. The system for producing sub-millimeter scale particles according to claim 15, wherein the layer of photosensitive material is a single layer of photosensitive material.

19. The system for producing sub-millimeter scale particles according to claim 18, wherein the light exposure system is configured to expose the single layer of photosensitive material to a plurality of light exposures, wherein said single layer of photosensitive material is moved by said stage control system between at least two light exposures to form an exposed pattern in said single layer of photosensitive material corresponding to the sub-millimeter scale particle being produced.

20. The system for producing sub-millimeter scale particles according to claim 18, wherein said light control system is configured to control a light exposure dose that the single layer of photosensitive material receives.

21. The system for producing sub-millimeter scale particles according to claim 15, wherein the light exposure system is configured to expose the layer of photosensitive material to a plurality of light exposures, wherein said layer of photosensitive material is moved by said stage control system between at least two light exposures to form an exposed pattern in said layer of photosensitive material corresponding to the sub-millimeter scale particle being produced.

22. A method of producing films having sub-millimeter scale substructures, comprising:
providing a substrate that has a layer of photosensitive material thereon;
exposing a portion of said layer of photosensitive material to a beam of light that has a preselected cross-sectional shape, a preselected cross-sectional size, a preselected wavelength, a preselected intensity of exposure, and a preselected duration of exposure, wherein said preselected cross-sectional size of said beam of light is smaller than a sub-millimeter scale substructure being produced by said exposing, and wherein said layer of photosensitive material has a preselected photoresponse to said beam of light;
moving at least one of said substrate or said beam of light relative to each other to follow a preselected path for making at least one of additional exposures or continuous exposure to result in a pattern in said layer of photosensitive material that corresponds to said sub-millimeter scale substructures in said films being produced;
further exposing said layer of photosensitive material to said beam of light at least one of continuously or at multiple points along said preselected path; and
processing said layer of photosensitive material subsequent to said exposing, said moving and said further exposing to remove unexposed material around said substructures in said layer of photosensitive material and to separate said film from said layer of photosensitive material and from said substrate to provide said film having sub-millimeter scale substructures.

\* \* \* \* \*